United States Patent
Claytor et al.

(10) Patent No.: US 11,566,918 B2
(45) Date of Patent: Jan. 31, 2023

(54) NON CONTACT POWER METER INDEPENDENT OF PLACEMENT OF FIELD SENSORS AROUND THE CABLE

(71) Applicant: U.S. Army Combat Capabilities Development Command, Army Research Laboratory, Adelphi, MD (US)

(72) Inventors: Kevin E. Claytor, Columbia, MD (US); David M. Hull, Adelphi, MD (US)

(73) Assignee: The United States of America as represented by the Secretary of the Army, Washington, DC (US)

( * ) Notice: Subject to any disclaimer, the term of this patent is extended or adjusted under 35 U.S.C. 154(b) by 102 days.

(21) Appl. No.: 16/992,174

(22) Filed: Aug. 13, 2020

(65) Prior Publication Data

US 2022/0049977 A1 Feb. 17, 2022

(51) Int. Cl.
*G01D 5/14* (2006.01)
*G01R 21/08* (2006.01)

(52) U.S. Cl.
CPC ............. *G01D 5/145* (2013.01); *G01R 21/08* (2013.01)

(58) Field of Classification Search
CPC ................................ G01D 5/145; G01R 21/08
See application file for complete search history.

(56) References Cited

U.S. PATENT DOCUMENTS

| | | |
|---|---|---|
| 8,560,256 B2 | 10/2013 | Gu et al. |
| 9,037,314 B2 | 5/2015 | Waite et al. |
| 9,081,041 B2 | 7/2015 | Friedrich et al. |
| 9,964,658 B2 | 5/2018 | Hull et al. |
| 10,613,123 B2 | 4/2020 | Gudmundsson et al. |
| 10,775,420 B2 | 9/2020 | Heintzelman et al. |
| 2005/0156587 A1 | 7/2005 | Yakymyshyn et al. |
| 2005/0286190 A1 | 12/2005 | Rostron et al. |
| 2009/0015262 A1* | 1/2009 | Strack ............... G01V 3/083 340/852 |
| 2009/0315555 A1 | 12/2009 | Heger |
| 2011/0221429 A1 | 9/2011 | Tamura |
| 2012/0016538 A1* | 1/2012 | Waite .................. G01C 21/005 701/3 |
| 2012/0187943 A1 | 7/2012 | Ausserlechner et al. |

(Continued)

OTHER PUBLICATIONS

"How the Sense Home Energy Monitor Works—Sense Blog," https://blog.sense.com/how-the-sense-home-energy-monitor-works/, sense.com, (c) 2017.

(Continued)

*Primary Examiner* — Akm Zakaria
(74) *Attorney, Agent, or Firm* — Eric B. Compton

(57) ABSTRACT

A non-contact power meter system for measuring power in an energized cable is provided. It includes: at least one electric field sensor; a plurality of magnetic field sensors, wherein the at least two magnetic field sensors together are configured to measure a magnetic field in a tangential direction and a radial direction with respect the energized cable measured; and a processor, which receives measurement signals from the various sensors, and is configured to measure power in the energized cable. A method of determining twist in an energized cable using non-contact power meter system(s) is also provided.

29 Claims, 18 Drawing Sheets

(56) References Cited

U.S. PATENT DOCUMENTS

| | | | | |
|---|---|---|---|---|
| 2014/0210460 A1* | 7/2014 | Kuhns | ............... | G01R 21/08 |
| | | | | 324/244 |
| 2014/0320125 A1* | 10/2014 | Leeb | ............... | G01R 15/207 |
| | | | | 324/252 |
| 2016/0025785 A1 | 1/2016 | Liu et al. | | |
| 2017/0102417 A1 | 4/2017 | Juan | | |
| 2018/0284168 A1* | 10/2018 | Grundy | ............ | G01R 19/2513 |

OTHER PUBLICATIONS

John S. Donnal, and Steven B. Leeb, "Noncontact Power Meter," IEEE Sensors Journal, vol. 15, No. 2, Feb. 2015, 1161.

Sean M. Heintzelman, ARL-TR-7507, "Non-Contact Circuit for Real-Time Electric and Magnetic Field Measurements," U.S. Army Research Laboratory, dated Oct. 2015.

Sean M. Heintzelman and David M. Hull, "Characterization and Analysis of Electric field Sensors," 2015 IEEE IAS Conference, Dallas, Texas, Oct. 18-22, 2015, presented Oct. 20, 2015.

David Lawrence, "Hardware and Software Architecture for Non-Contact, Non-Intrusive Load Monitoring," Master's Thesis, Massachusetts Institute of Technology ("Submitted Jan. 19, 2016;" presently available on-line, first date of publication unknown).

David Lawrence, John S. Donnal, and Steven Leeb, "Current and Voltage Reconstruction From Non-Contact Field Measurements," IEEE Sensors Journal, vol. 16, No. 15, Aug. 1, 2016, 6095-6103.

Adam Stone, "Measuring Power New initiative breaks ground in alternative energy technology," C4ISRNET, vol. 16, No. 4, May 2017, p. 22.

Richard A. Jones, "Improving Shipboard Maintenance Practices Using Non-Intrusive Load Monitoring," Department of Mechanical Engineering, Massachusetts Institute of Technology. Master of Science in Mechanical Engineering. (2007).

Lorek, M. C., et al. (2014). "COTS-Based Stick-On Electricity Meters for Building Submetering." IEEE Sensors Journal 14(10): 3482-3489.

Xu, Q. R., et al. (2013). "Stick-On Piezoelectromagnetic AC Current Monitoring of Circuit Breaker Panels." IEEE Sensors Journal 13(3): 1055-1064.

Declaration of Kevin Clayton (dated Aug. 18, 2020).

Declaration of Eric Compton (dated Sep. 15, 2020).

* cited by examiner

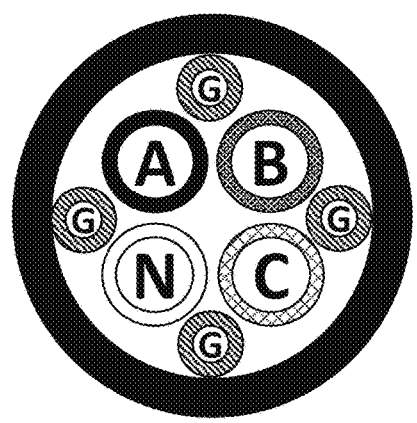
FIG. 1A
(Conventional)

Magnetic Field Sensor Configurations

Performance for a range of designs

Processing Pipeline

Exemplary Display Screen for Output

Field vectors from each conductor

Calibration Matrix $$A\vec{x} = \begin{bmatrix} S_{AN}(\theta) & S_{BN}(\theta) & S_{CN}(\theta) \end{bmatrix} \begin{bmatrix} I_{AN} \\ I_{BN} \\ I_{CN} \end{bmatrix} = H_{obs}$$

FIG. 10B

The Inversion Matrix S $S(\theta)\overline{IV} = \overline{H}_{obs}$ $$\begin{bmatrix} s_{V1}(\theta) & 0 & 0 & 0 \\ s_{V2}(\theta) & 0 & 0 & 0 \\ 0 & s_{AN,1}(\theta) & s_{BN,1}(\theta) & s_{CN,1}(\theta) \\ 0 & s_{AN,2}(\theta) & s_{BN,2}(\theta) & s_{CN,2}(\theta) \\ \vdots & \vdots & \vdots & \vdots \\ 0 & s_{AN,n}(\theta) & s_{BN,n}(\theta) & s_{CN,n}(\theta) \end{bmatrix} \begin{bmatrix} V \\ I_{AN} \\ I_{BN} \\ I_{CN} \end{bmatrix} = \begin{bmatrix} e_1 \\ e_2 \\ h_1 \\ h_2 \\ \vdots \\ h_n \end{bmatrix}$$

$\overline{IV} = S(\theta)^{-1}\overline{H}_{obs}$

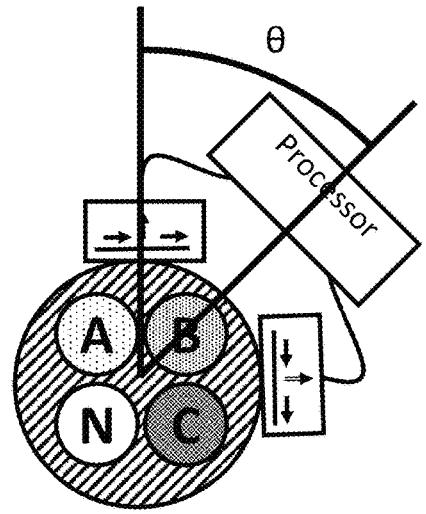

Where:
- $\theta$ = Angle of sensor assembly around the cable.
- $I_{XN}$ = Current applied to Phase $X$ with return current along the neutral, $N$.
- $H_{obs}$ = Observed magnetic fields.
- $s_{Vi}(\theta)$ = Matrix element that describes the field seen by electric field sensor $i$ at assembly angle $\theta$ for a 1 volt potential applied to Phase $A$ with phase angle 0°, Phase $B$ with phase angle -120°, and Phase $C$ with phase angle +120°.
- $s_{XN,i}(\theta)$ = Matrix element that describes the field seen by magnetic field sensor $i$ at assembly angle $\theta$ for a 1 Amp load applied to Phase $X$ with a return current along the neutral, $N$.

FIG. 10C

NON CONTACT POWER METER INDEPENDENT OF PLACEMENT OF FIELD SENSORS AROUND THE CABLE

GOVERNMENT INTEREST

The invention described herein may be manufactured, used and licensed by or for the U.S. Government without the payment of royalties thereon.

BACKGROUND OF THE INVENTION

Field

Embodiments of the present invention generally relate to power-usage monitoring, and more particularly to, devices used for monitoring power usage in power cables. More particularly, they provide a non-contact power meter independent of placement of electric and magnetic field sensors around the cable.

Description of Related Art

There are a number of devices for monitoring power usage. In general, these conventional devices require disabling power to the cable, and using an electrician for proper installation (physical attachments) of voltage and current probes.

More recently, voltages and currents in a cable have been detected non-invasively by using electric and magnetic field sensors. This allows non-contact and non-invasive power monitoring, which has several advantages; namely, it can be performed safely and without interrupting existing power. For example, U.S. patent application Ser. No. 15/710,894 filed Sep. 21, 2017, herein incorporated by reference it its entirety, discloses a non-contact multi-phase cable sensor. In embodiments, that cable sensor may include an electric field sensor and three or more magnetic field sensors spaced in a direction transverse to the energized cable measured. Those multiple magnetic field sensors are identical in their configuration and orientation to measure the magnetic field in the tangential direction only.

Experiments using this sensor arrangement have been conducted to make power measurements on large, multi-conductor cables. It has been found, however, that the accuracy of the magnetic field measurements is dependent on the location of the sensors around the cable. More, it has been found that additional measurements of the tangential field made by closely-spaced sensors do not necessarily improve accuracy. This is the case, for example, where the field is changing uniformly across three closely-spaced magnetic sensors, such that the field measured by the middle sensor is essentially equal to the average field measured by the other two sensors. The middle sensor provides relatively little additional useful information, and the resulting calibration matrix is ill-conditioned.

Thus, improvements in magnetic field measurement would be useful.

BRIEF SUMMARY OF THE INVENTION

Embodiments of the present invention are directed to power-metering systems and monitoring methods.

According to embodiments, a non-contact power meter system for measuring power in an energized cable comprises: at least one electric field sensor; a plurality of magnetic field sensors, wherein the at least two magnetic field sensors together are configured to measure a magnetic field in a tangential direction and a radial direction with respect the energized cable measured; and a processor, which receives measurement signals from the various sensors, and is configured to measure power in the energized cable.

There may be at least N channels of magnetic field sensor directional measurement data provided to the processor for N conductors for transmission of electrical power of the energized cable. For instance, N may be at least 3.

In the systems, there may be one or more sensor units, for which the field sensors are located. Each sensor unit may comprise a printed circuit board (PCB). More, the one or more sensor units may comprise a magnetic field sensor sub-assembly and/or an electric field sensor sub-assembly.

There are various ways in which the at least two magnetic field sensors together are configured to measure a magnetic field in a tangential direction and a radial direction with respect the energized cable measured. For instance, one of the plurality of magnetic field sensors may be oriented in a different direction from other magnetic field sensor(s) of the plurality of magnetic field sensors. Also, one of the magnetic field sensor physically may be rotated in a different direction of the same plane or a different orthogonal plane from the other magnetic field sensor(s).

The plurality of magnetic field sensors may be configured to measure the magnetic field in substantially one direction, two orthogonal directions, or three orthogonal directions. The directions do not have to be physically orthogonal, but it helps if they are orthogonal in the linear algebra sense: that is, so that the condition number of the calibration matrix is as small as possible.

In some configurations, the systems includes at least two sensor units. The at least two sensor units may have separate housings and may be individually positionable with respect to the energized cable measured. Or at least two sensor units can share a common housing. The at least two sensor units may be positioned at substantially the same axial location with respect to the energized cable: that is, on either side of the cable, at the same position along the cable. Alternately, and especially if the conductors in the cable are twisted, the sensors can be positioned in a straight line along the length of the cable.

The one or more sensor units can further comprise means for attaching the system to a power cable. For instance, the cable attaching means may include a clip, a strap, a fastener, a tape, and/or an adhesive.

The processor may be configured to perform simultaneous electric and magnetic field measurements of an energized conductor in the energized cable. More particularly, the processor may be configured to measure voltage and current magnitudes and phases in real time for each conductor in the energized cable. The processor may be a part of the integrated sensor unit or may (remotely) communicate with the sensor unit(s).

In some embodiments, at least one of the plurality of magnetic field sensors may also be configured to measure a magnetic field in an axial direction with respect the energized cable measured. This allows for further features of the system. For instance, the processor may be further configured to estimate the twist of conductors in the energized cable measured.

A method of determining twist in an energized cable, according to an embodiment, may comprise: using one or more power measurement systems configured to provide for axial magnetic field measurements, taking multiple magnetic field measurements at different axial positions along the energized cable; characterizing the measured magnetic fields of the energized cable for the in the tangential, radial directions, and axial directions; and correlating displacements of magnetic field measurement values in the tangential, radial and axial directions to cable twist based on known cable geometries and permissible ranges of their twist.

These and other embodiments of the invention are described in more detail, below.

BRIEF DESCRIPTION OF THE DRAWINGS

So that the manner in which the above recited features of the present invention can be understood in detail, a more particular description of the invention, briefly summarized above, may be had by reference to embodiments, some of which are illustrated in the appended drawings. It is to be noted, however, that the appended drawings illustrate only typical embodiments of this invention and are therefore not to be considered limiting of its scope, for the invention may admit to other equally effective embodiments, including less effective but also less expensive embodiments which for some applications may be preferred when funds are limited. These embodiments are intended to be included within the following description and protected by the accompanying claims.

FIGS. 1A-1E show a typical 3-phase power cable and aspects thereof.

FIGS. 10A-10C show aspects of the section (D) of the processing of FIG. 9A according to embodiments.

DETAILED DESCRIPTION

According to embodiments, a non-contact power meter system for measuring electrical power in an energized cable is configured to sense magnetic fields and/or electric fields in multiple locations and orientations around a multi-conductor power cable. Magnetic and electric field measurements around power cables are used for power monitoring and metering without invasive and dangerous current and voltage probes. The operation of the improved non-contact power meter system is independent of placement of these field sensors around the cable.

The term "cable," as used here, means a single or multi-conductor electrical cable for power transmission. To transmit power, it is energized and conducting. It may be synonymous with terms cord(s), wire(s), line(s), conduit(s) or the like which conduct electricity. The number of conductors, dimensions/size, current/voltage/power ratings, materials, etc. may be selected according to a particular application, as generally known in the art.

It has been found that, for multi-conductor cables, there is generally a non-zero component of the magnetic field in the radial direction. This arises due to the placement of the conductors away from the axis of symmetry. Due to this, the magnetic field vectors at a given point around the cable do not point purely in the tangential direction as further explained with respect to FIGS. 1A-1E.

Figure 1B:
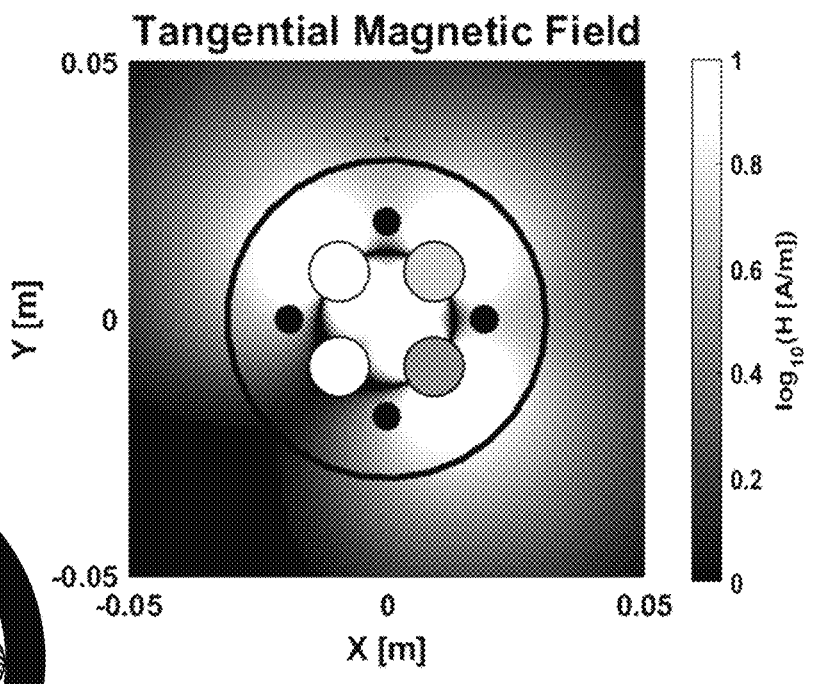
Figure 1C:
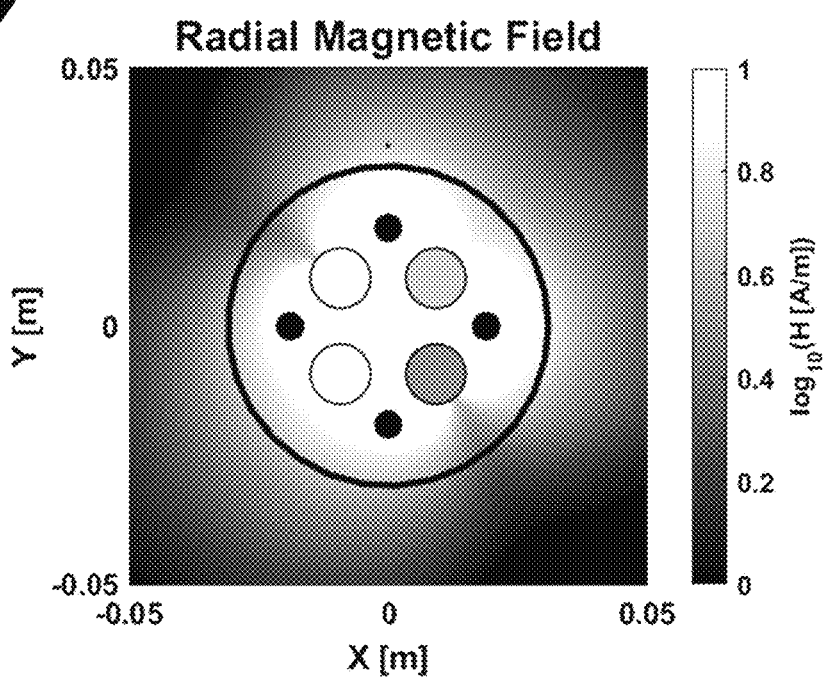
Figure 1D:
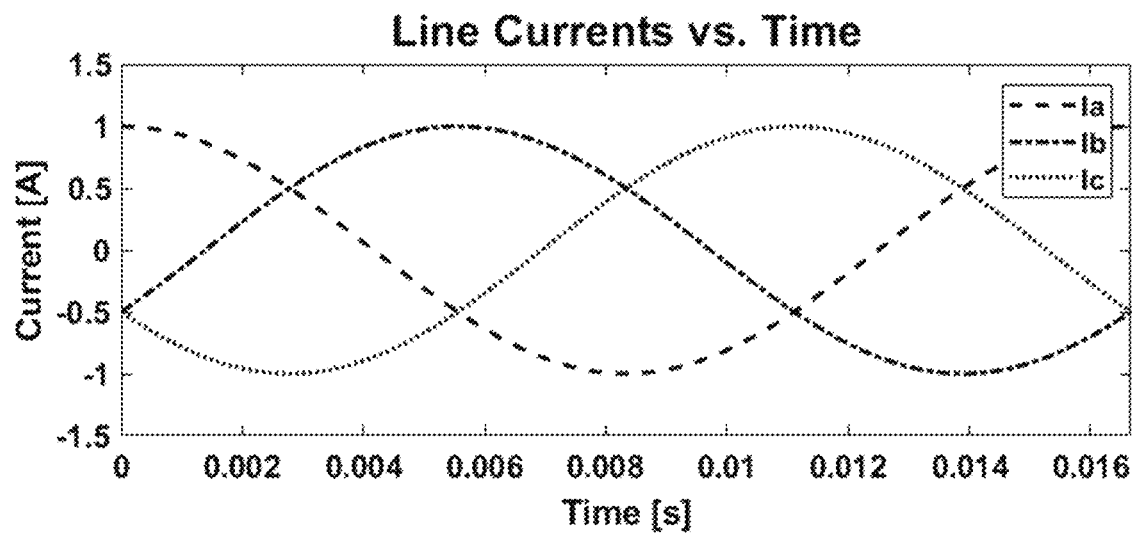
Figure 1E:
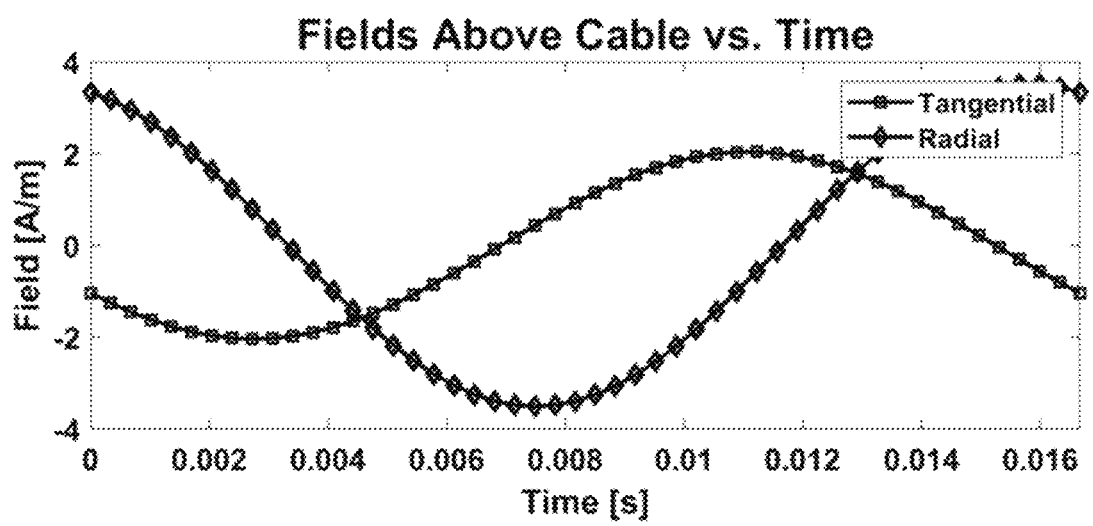

FIG. 1A is a schematic of the cross-section of a typical 3-phase power cable. It is formed of an insulating sheath and four primary conductors, including power conductors, labeled A, B and C, and a neutral conductor labeled N, as well as corresponding ground conductors labeled G. Constituent magnetic fields are produced in the tangential direction around each of these current-carrying wires. However, for multi-conductor cables, the structure of the composite magnetic field is more complex as the conductors are distributed in the cable, and the currents can have different magnitudes and relative phases. FIG. 1B and FIG. 1C show simulated tangential and radial RMS magnetic fields, respectively, for a 3-phase power cable carrying balanced 3-phase currents to a resistive load. From inspection, it should be appreciated that tangential and radial fields vary at different points around the cable. More, the radial field may be larger than the tangential field at certain locations. FIG. 1D is a plot showing the time dependence of the three line currents along power-conductors A (line $I_a$), B (line $I_b$) and C (line $I_c$). These line currents are 120° out of phase with each other, and the sum of the return currents is assumed to flow on N, the neutral conductor. FIG. 1E is a plot showing the time dependence of the tangential and radial components of the magnetic field at the point 35 mm direct above the cable. (i.e., (x, y)=(0, 0.035) m) for the illustrated line currents; this sensor point is shown as a black dot in FIGS. 1B and 1C. As can be observed, the radial field exceeds the tangential field in magnitude and appears with a different phase. The aforementioned '894 patent application overlooked the radial component of the magnetic field.

Substantial improvement can be made to the accuracy of the measurements of the current in each conductor by measuring the magnetic field in the radial direction as well as in the tangential direction. Thus, by including one or more measurements of the radial component of the magnetic field surrounding the energized cable, it has been found that the accuracy of the current measurement can be (i) significantly improved for corresponding points on the cable, and (ii) made more uniform regardless of the location around the cable. This improvement is possible because the field is more effectively sampled, and this results in a more well-conditioned calibration matrix.

Figure 2A:
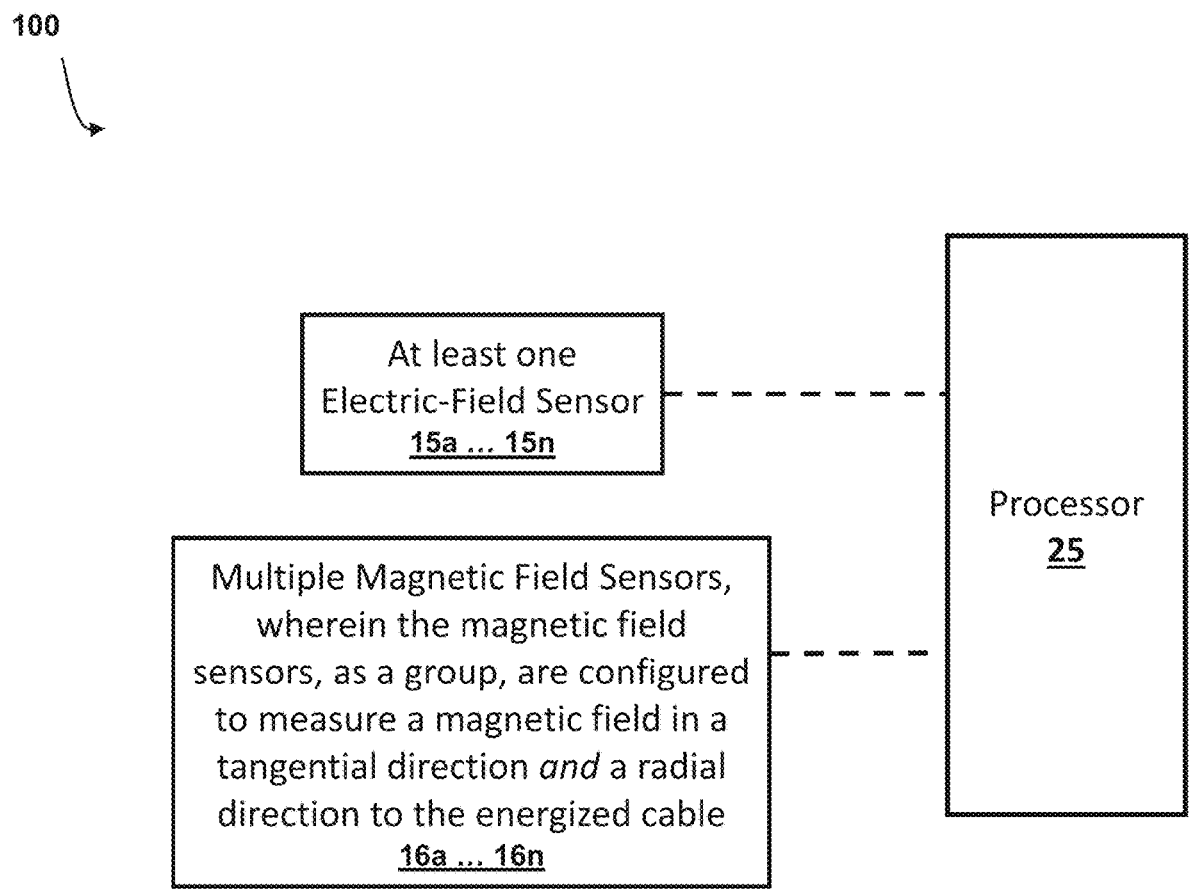
FIGS. 2A, 2B, and 2C are illustrative schematics of a non-contact power meter system for measuring power in a cable according to embodiments of the present invention.
Figure 2B:
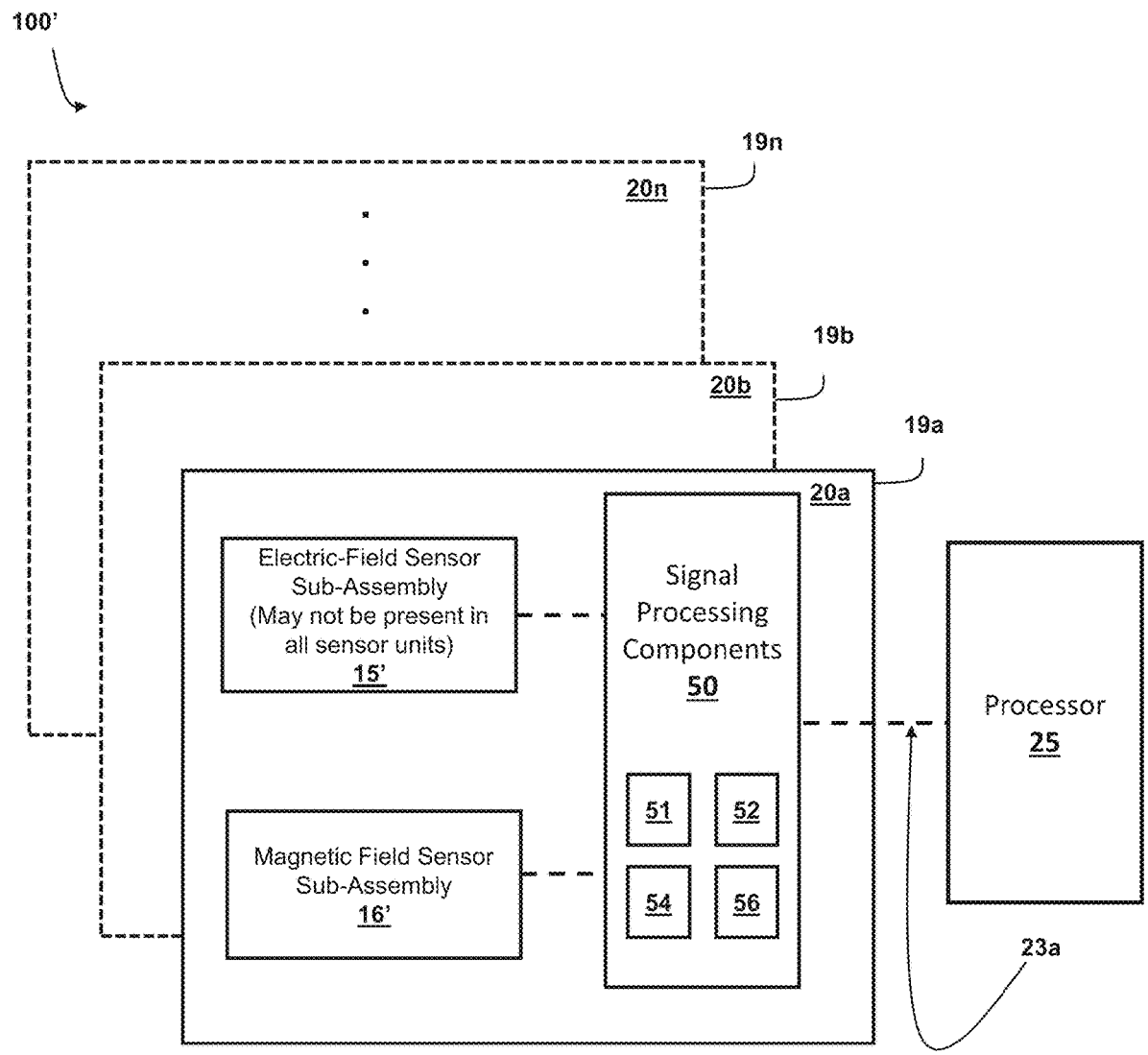
Figure 2C:
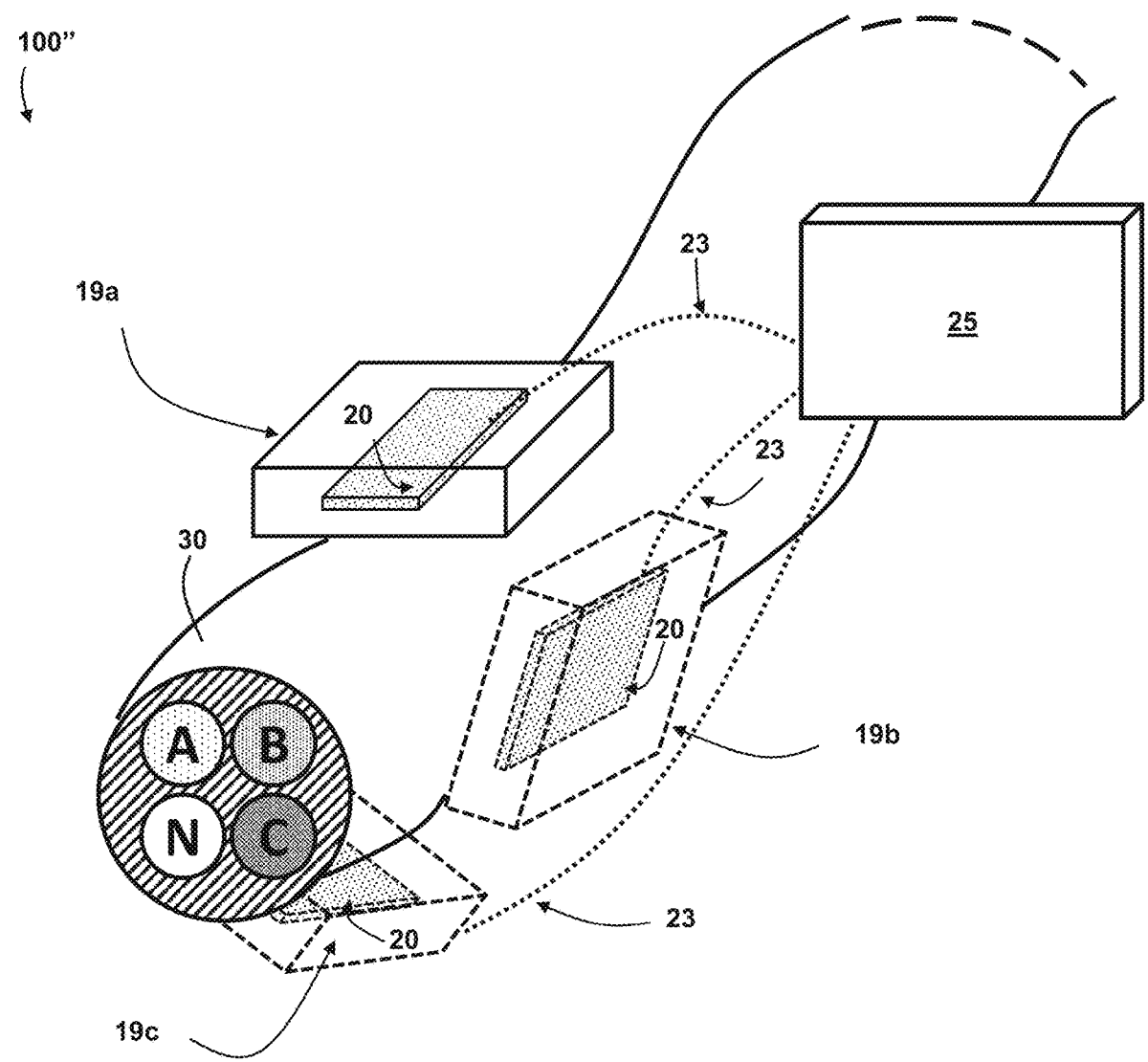

FIGS. 2A, 2B, and 2C are illustrative schematics of a non-contact power meter system for measuring power in a cable according to embodiments of the present invention.

FIG. 2A is a high level overview schematic of the basic elements of the power measurement system 100; FIG. 2B is a more detail schematic of the system; and FIG. 2C is an illustration of the system in one exemplary operation.

As shown in FIG. 2A-2C, the embodiments herein provide a non-contact power meter system (hereinafter "system 100"). The sensor system 100 provides for a multi-channel arrangement of sensors for simultaneous, real-time measurement of electric and magnetic fields near the surface of the power cable 30. For instance, the system 100 may include one or more sensor units 19, having electric field sensors and magnetic field sensors, placed near the outer surface of an energized cable 30 and communicatively coupled to a processor 25 via links 39. The system 100 provides for a multi-channel sensor for simultaneous, real-time measurement of electric and magnetic fields near the surface of the energized cable 30. The cable 30 may be any energized 1-, 2-, 3- or higher-phase cable, in example embodiments.

The system 100 is comprised of at least one electric field sensor 15a . . . 15n; and at least one magnetic field sensor 16a . . . 16n. The various field sensors of the system 100 may be distributed over one or more sensors units 19 as further shown in FIG. 2B. In some embodiments, the sensor units 19 may be separate and discrete units (see, e.g., FIGS. 6A-6C and 6E), each having its own housing. This provides much more flexibility in terms of their placement locations around the cable. Or, in other embodiments, multiple sensors units 19 can share a common housing (see, e.g., FIG. 6D). This can make placement quicker, and ensures that the same relative spacing for various sensors is maintained. The sensor unit(s) 19 may be spaced at substantially the same axial location with respect to the energized cable 30 (FIG. 2C). More particularly, the sensor units 19 of the system 100 may be located in largely the same cross-sectional plane of the energized cable 30.

The magnetic-field sensors 16a . . . 16n, together as group (i.e., across all sensors units 19 of the system 100), are configured to measure a magnetic field in a tangential direction and the radial direction to an energized cable 30. Various combinations and arrangements of magnetic field sensors are possible based on the energized cable 30 being measured.

The individual field sensors 15 and 16 output electrical signals corresponding to respective measurements at different points and in different directions, in general. Processor 25 receives measurement signals from the field sensors, and is configured to estimate power in the energized cable. A communication link 23 couples the sensor unit(s) 19 to the processor 25 for transmitting data between the two. The link 23 may be physical wired connection or configured to provide for wireless communications.

For multi-conductor cables, a composite magnetic field is comprised of components for each of the conductors. Multiple measurements are taken and a calibration matrix determined to map the measured fields to currents in the conductor. With the calibration matrix, a set of measured magnetic fields can be transformed into a set of line currents in the energized cable.

The energized electric power cable 30 generates low-frequency electric and magnetic fields that are related to the voltages and currents. Electric and magnetic fields obey the Principle of Superposition. That is, there is a linear relationship between a set of sources and a set of field measurements. And, one may extract information, such as voltage and current on each phase, with (near-field) electric and magnetic field theory and the Principle of Superposition. Therefore, in general, we can solve for N unknown sources (e.g., line voltages or currents) with N (or more) electric or magnetic field measurements using linear algebra. The set of field measurements is transformed into a set of source parameter estimates by multiplying by a calibration matrix of rank N. If the field measurements are not linearly independent, then the calibration matrix is ill-conditioned, and any measurement errors are multiplied in the parameter estimates. Therefore, it is desirable to make the field measurements as independent as possible. For a given number of magnetic field sensors, this can be done by increasing the spatial diversity of the sensors (i.e., distributing the sensors around the cable), and/or by increasing the field diversity of the sensors (i.e., measuring more than one component of the magnetic field).

Electric fields in one or more different sensor unit(s)' locations and/or orientations around the multi-phase cable can be used to better measure the line voltages, which can be used for power determinations. The electric field sensor(s) 15a . . . 15n output an electrical signal corresponding to the measured electric field. For instance, the voltage output may be proportional to the measured electric field. If multiple sensor units 19 are provided in the system 100, not every one of them necessarily includes an electric field sensor 15 (or electric field sensor subassembly 15').

The magnetic field sensor sub-assembly 16' may be comprised of at least one or more magnetic field sensors 16a . . . 16n. The magnetic field sensors output an electrical signal corresponding to the measured magnetic field. For instance, the voltage output may be proportional to the measured magnetic field. Together, the magnetic field sensors provide at least N channels of magnetic field data to the processor 25. These channels of data allow us to estimate the source currents in N individual conductors for transmission of electrical power of the energized cable 30.

Generally, the system 100 provides for an integration of electric and magnetic field sensors sub-assemblies 15', 16' into a PCB 20 for performing voltage and current measurements on multi-conductor cables 30 without "tapping" any of the wires. In use, the bottom (sensor) side of the PCB of the system 100 may be placed near (or attached to) the outside of a multi-conductor energized power cable 30, such as a 240-V service-entrance power cable to a building. Two or more sensor PCBs may be used for more complex power cables, including 3-phase cables.

Multiple field sensors can be used to measure the (non-uniform) field at multiple points, and/or in multiple directions. Tangential (transverse) and/or radial magnetic field sensors are used to estimate the currents around multi-phase cables. Additionally, axial field measurements can be made (with additional sensors and/or sensors have additional direction measurement capabilities); these can be used to determine or estimate the twist of conductors in the cable.

FIG. 2B show the non-contact power meter system 100 formed of one or more sensor units 19. (It is noted that while three sensor units 19 are depicted, this is for illustrative purposes; in some embodiment, only one such unit may be provided for in some embodiments). If there are multiple sensor units 19 provided in the non-contact power meter system 100 then the magnetic field sensor 16' thereof could have as few as one magnetic-field sensors 16a. The sensor units 19 may each be formed of a printed circuit boards (PCBs) 20a, 20b . . . 20n, with each PCB 20 having an electric field sub-assembly 15' and a magnetic field sub-assembly 16'. The PCBs 20 also can optionally include signal processing components 50 (such as microcontroller 51, ADC 52, variable offset circuit 54, and amplifier 56) which are discussed further below with respect to FIG. 3.

The embodiments herein provide for the integration of electric and magnetic field sensors for measuring power on 1-, 2-, 3-phase or higher-phase energized power cables. As mentioned above, the linear relationship between sources and fields means that we can solve a system of linear equations for N unknown sources (e.g., line voltages or currents) with N (or more) electric or magnetic field measurements. Of course, measurement accuracy may be improved by providing additional electrical and/or magnetic field sensors increases spatial diversity.

In a single-phase power cable having a signal power conductor, the measured magnetic field is linear and in phase with the current. A single magnetic field sensor can be used. Coulomb's and Biot-Savart's Laws, respectively, relate the electric and magnetic fields to the voltage V and current I on a single straight energized wire:

$$\vec{E} = \frac{\rho(V)}{\varepsilon_0 2\pi d} \hat{a}_r \quad (1)$$

$$\vec{B} = \frac{\mu_0 I}{2\pi d} \hat{a}_\varphi, \quad (2)$$

where $\mu_0$ and $\varepsilon_0$ are magnetic permeability and electric permittivity constants, $\rho$ is the surface charge density on the wire, and $\alpha_\varphi$ and $\alpha_r$ are vectors pointing in the direction of the field in cylindrical coordinates. Superposition principles are used with Coulomb's and Biot-Savart's Laws in multi-wire configurations (i.e., 2- and 3-phase power cables). The boundary element method or electromagnetic models are typically used to solve for $\rho(V)$.

In a split-phase (e.g., 120/240-V, sometimes called 2-phase), the measured magnetic field is the superposition of the constituent fields from two power conductors. In this case, multiple sensors can be used to sense the combined field at several different locations and/or orientations. For example, for a typical 200-A home service split-phase (120/240-V) at least two magnetic field sensors can be used to estimate the currents in two conductors (or two power conductors and a neutral). For a 3-phase, 200-A, 240-V power cable (example shown in FIG. 1A), at least three magnetic field sensors can be used to estimate the currents in the three power conductors.

FIG. 2C shows a non-limiting example of non-contact power meter system 100" being used to measured power in a 3-phase cable according to an embodiment. Three sensor units 19a, 19b, and 19c are shown here positioned around the cable 30. Together, over all the sensor units 19a, 19b, 19c of the system 100, the magnetic field sensors 16a . . . 16n provide at least N channels of magnetic field sensor measurement data to the processor 25 for N individual conductors for transmission of electrical power of the energized cable. The magnetic field sensors may measure the magnetic field at N locations and/or directions. It is noted that magnetic-field sensors do not have to be directional; one could use total-field magnetometers, or a mix of total-field and vector-component (directional) sensors. (In general, the ± vector component is associated with ± current flow. So if using a total field (non-vector) sensor, one could assume a positive current flow. The data processing would be somewhat different than current "phasor" processing primarily discussed herein, in that it would produce something like a vector in a half-space. The half-space could be found by comparing the simulated magnetic field phase to the electric field sensors).

The sensor unit(s) 19 provided by the embodiments herein may be positioned proximate or adjacent to (e.g., "clipped" or "strapped" onto) the outside of an insulated cable 30 in order to monitor overall power usage. For example, the clipping or strapping may occur using a flexible strap with hook and loop-type fasteners such as Velcro® fasteners, or using electrical tape or other electrical adhesive wrapped around the sensor unit(s) 19 and cable 30. Additionally, the sensor unit(s) 19 may be permanently fixed to the insulated cable 30. The system 100 does not require power to be shut off by an electrician for installation of the sensor units 19. Accordingly, the embodiments herein provide for a non-invasive, non-interruptive technique, which may be readily installed or moved by a user.

Figure 3:
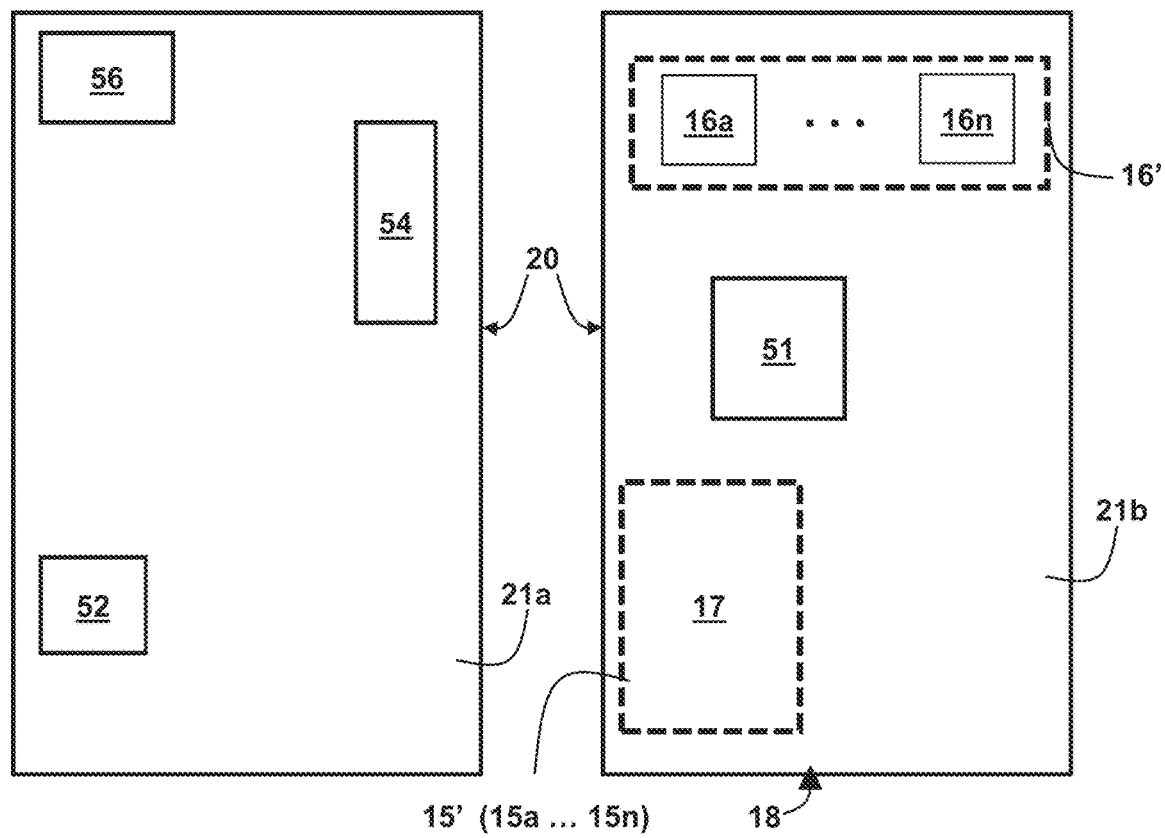
FIG. 3 is a non-limiting example of a printed circuit board for a sensor unit of the non-contact power meter system according to an embodiment.

FIG. 3 is a non-limiting example of a printed circuit board (PCB) 20 for the sensor unit 19 of the non-contact power meter system 100 according to an embodiment. As shown, the PCB 20 includes a first side 21a and a second side 21b which may be oriented as the top and bottom sides, respectively in the sensor unit 19. For measuring electric and magnetic fields, electric and magnetic field sensor sub-assemblies 15, 16 may be provided. The sensors may be integrated directly on or into the PCB 20 forming the subassembly; i.e., one or more conductor parts of a PCB 20, or formed as one or more integrated circuits forming the sub-assembly mounted on into the PCB 20. Signal conditioning and processing components are also provided on the PCB 20 as further discussed herein. The PCB 20 could be a flexible circuit board to better conform to the shape of the cable.

The electric-field sensor sub-assembly 15' is comprised of one or more electric field sensors 15a . . . 15n configured to measure an electric field. They may be an E-field sensor formed of a sensing electrode. In FIG. 3, one electric field sensor is provided which is an E-field sensor with a sensing electrode 17 has been nominally illustrated according to a most basic embodiment. The electric field sensor(s) output an electrical signal corresponding to the measured electric field, or to the time-derivative of the electric field, or to the ambient voltage. For instance, the voltage output may be proportional to the measured electric field. More particularly, in an example, the electric field sensor 15 may be configured as a charge induction sensor, with a voltage output that is proportional to the time-derivative of the electric field. The one or more electric field (or E-field) sensors 15a . . . 15n are used to monitor the voltage on a conductor of a cable in a voltage-regulated power system. (Note: "voltage-regulated" means that the magnitude of the voltage waveform is nearly constant). The phase of the voltage waveform can be used as a reference for the estimates of the line currents. The voltage estimate may also be used for computing power (P=V*I).

The output current from the charge induction electric-field sensing electrode 17 is proportional to the derivative of the external E-field, as given by:

$$i_{out} = \frac{dQ}{dt} = \varepsilon A_{eff} \frac{dE_Z}{dt} = \omega \varepsilon A_{eff} E_{z0} \sin(\omega t + \varphi) \quad (3)$$

where $\varepsilon$ is the free space permittivity, $\omega$ is frequency, $\varphi$ is the E-field phase, $E_{z0}$ is the amplitude of the electric field, and $A_{eff}$ is the effective area of the charge induction electric-field sensing electrode 17. The effective area is the physical area of region 18, multiplied by an enhancement factor that is determined by the geometry of the sensor and the sensing environment. For flat electrodes, this enhancement factor may be approximately one, in one example. The current of the charge induction electric-field sensing electrode 17 is fed into a transimpedance amplifier (not shown) with a gain of 1 V/mA. The final output of the charge induction electric-field sensing electrode 17 is:

$$V_{out} = 1000 i_{out} = \beta \omega E_{z0} \sin(\omega t + \varphi) \quad (4)$$

where $i_{out}$ is used from Eq. (4) and a constant $\beta$ is introduced as being equal to 1000 $\varepsilon A_{eff}$, which represents a frequency-independent transducer gain. This generates a relationship constant for reverse-calculating the electric field E (neglecting phase differences):

$$\beta \omega = \frac{V_{out}}{E} \quad (5)$$

where $\beta$ is presented in physically-meaningful units.

In some embodiments, a guard element may be provided, e.g., around the electrode and on the next PCB layer, so that the electrode 17 is generally only sensitive to E-fields from sources under the PCB (i.e., not to other cables, machinery, lights, etc. above the PCB. An example of such a guard is shown in FIG. 5 of the aforementioned '894 patent application.

The magnetic field sensor subassembly 16' may be comprised of one or more magnetic field sensors 16a . . . 16n. The magnetic field sensors of all sensor units 19, together, are configured to measure the tangential component of the magnetic field near the energized cable 30, and optionally in at least one other direction (e.g. radial and/or axial). The magnetic field sensors output one or more electrical signal(s) corresponding to the measured magnetic field component(s). For instance, the voltage output may be proportional to the measured magnetic field in the tangential direction.

The magnetic field sensors 16a . . . 16n may be Hall-Effect (B-field) sensors that monitor the magnetic field due to the varying currents on the cable 30, although, the embodiments herein are not restricted to these types of sensors. Various integrated circuit or "chip" sensors may be used for magnetic field effect sensors 16a . . . 16n. Indeed, other example magnetic field sensors which may be utilized include magneto-resistive (MR) sensors, including anisotropic magneto-resistive (AMR), giant magneto-resistive (GMR), tunnel magneto-resistive (TMR), colossal magneto-resistive (CMR), and extraordinary magneto-resistive (EMR) sensors. Other chip-scale sensors, including small coil-based sensors, fluxgates, or other types of magnetometers, may also be used. Small coil sensors or other types of magnetometers may also be used, depending on the specific application.

Figure 4A:
FIGS. 4A, 4B and 4C depict some examples of magnetic field sensors having different-axes sensitivities and corresponding known integrated circuits.
Figure 4B:
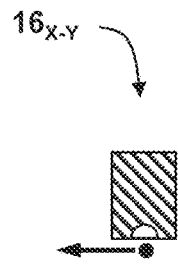
Figure 4C:

FIGS. 4A, 4B and 4C depict some examples of magnetic field sensors having different-axes sensitivities and corresponding known integrated circuits (IC). A simplistic depiction of the IC is shown in those figures. The sensors may be sensitive in one dimension substantially along a single axis (e.g., x-axis), two dimensions along substantially two orthogonal axes (e.g., x- and y-axes) or three dimensions substantially along three orthogonal axes (e.g., x-, y-, and z-axes). The direction(s) which the IC is sensitive to the magnetic field are also shown with respect to the simplistic depictions of the left. The ICs may be oriented so that their sensitivities align with the tangential, radial and/or axial directions of the cable 30. The sensors can also measure a linear combination of field components, or the total (scalar) field.

In particular, FIG. 4A depicts a single-axis sensor $16_x$ which measures the magnetic field in only one direction (i.e., one of the tangential, radial, and axial directions). FIG. 4B depicts a two-axis sensor $16_{x-y}$ which measures the magnetic field in two orthogonal directions (i.e., two of the tangential, radial, or axial directions). FIG. 4C depicts a three-axis sensor $16_{x-y-z}$ which measures the magnetic field in three orthogonal directions (i.e., tangential, radial, and axial directions).

Table I, below, lists some commercially-available 1-, 2 and 3-axes magnetic field sensors which may be used. These known parts were chosen to be exemplary; actual part selection would be subject to sensor sensitivity and package constraints, which in turn depends on the application.

TABLE I

Exemplary, Commercially-Available Magnetic Field Sensors

| | 1-axis | 2-axes | 3-axes |
|---|---|---|---|
| Manufacturer | Allegro MicroSystems | NXP USA Inc. | Melexis |
| Part Number | A1304ELHLX-T | KMZ41,118 | MLX90333 |
| Description | Analog Hall-effect sensor | Magnetoresistive Sensor x, y axis, 8-pin SOIC | Hall Effect Sensor x, y, z axis, 8-pin SOIC |

Figure 5A:
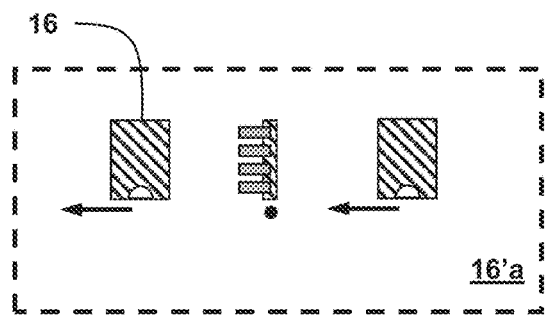
FIGS. 5A-5D are schematics of four non-limiting embodiments of magnetic field sensor sub-assemblies that may be formed on a printed circuit board.
Figure 5B:
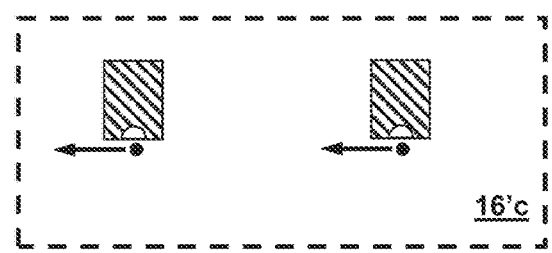
Figure 5C:
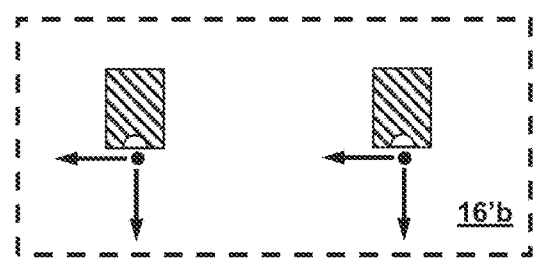
Figure 5D:
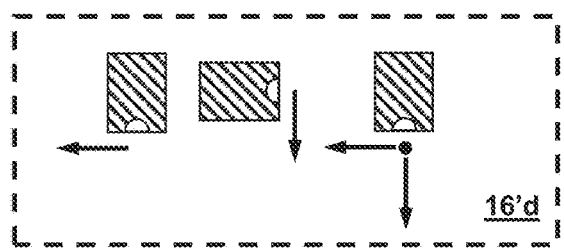

FIGS. 5A-5D are schematics of four non-limiting embodiments of magnetic field sensor sub-assemblies 16' that may be formed on a printed circuit board (PCB) 20. Selection and use of the sub-assembly of course depends on the availability of sensors with the required sensitivity in the various sensitive directions. Others sub-assembly embodiments certainly exist beyond what is shown here. FIG. 5A shows a magnetic field sensor sub-assembly 16'a having three magnetic field sensors with the left and right sensors measuring the magnetic field in the tangential direction and the center sensor measuring the magnetic field in the radial direction. For instance, each of the sensors may be identical in construction (i.e., the same integrated circuit model which measure the field in a single direction; the right and left sensors are oriented in the one direction, whereas the center sensor may be physically rotated in an orthogonal direction (out of plane) thereto (this may require additional mechanical supports). FIG. 5B shows another sub-assembly 16'b which is formed of two magnetic field sensors. These sensors measure the magnetic field in both the radial and tangential directions. The sensors may be identical in construction (i.e., the same integrated circuit model which measure the field in two orthogonal directions) and are oriented in the same direction. FIG. 5C shows one more sub-assembly 16'c which is formed of two 3-D magnetic field sensors. These sensors measure the magnetic fields in the axial, radial and tangential directions. For instance, the sensors may be identical in construction (i.e., the same integrated circuit model which measure the field in three orthogonal directions) and oriented in the same direction. (This arrangement may yield additional benefits, such as measuring cable twist, as later described with respect to FIGS. 11A-D). FIG. 5D shows a further sub-assembly 16'd which is formed of three magnetic field sensors having different sensor orientations and constructions. The left sensor measures the magnetic field in the tangential direction; the center sensor measures the magnetic field in the radial direction; and the right sensor measures the magnetic fields in the axial, radial and tangential directions. For instance, the left and center sensors may be identical in construction (i.e., the same integrated circuit model which measure the field in the one directions) but oriented in different directions, and the right sensor is different (i.e., an integrated circuit model which measure the field in the three orthogonal directions.

It should be appreciated that, for different orientations of the same type of sensor, the sensors may be physically rotated with relative to each other. Rotations in orthogonal direction (out of plane of the PCB, as in FIG. 5A) may require additional mechanical supports, whereas rotations in the plane of the PCB (as in FIG. 5D) should not require additional support.

Turning again to FIG. 3, the magnetic field sensor sub-assemblies 16' having the magnetic fields sensors 16a . . . 16n may be integrated directly on the single PCB 20, or they may comprise a separate assembly (such as a board) which in turn is mounted on the PCB 20. As shown, the magnetic-field sensor sub-assembly 16' may be positioned on the bottom side 21b, nearest the placement of the cable 30, for instance. The electric field sensor sub-assembly 15' may similar be positon on bottoms side 21b. To condition sensor outputs, a current preamp (e.g., a variable offset circuit 54 and associated passive components) may be located on the top side 21a of the PCB 20 as well as the voltage amplifier (e.g., op-amp 56) and analog-to-digital converter (ADC) 52. A microcontroller 51 may also be placed on the top side 21a of the PCB 20. However, the specific layout may be adjusted to maximize sensitivity, minimize PCB area, separate analog and digital grounds, and other design and/or manufacturing considerations. In the example embodiment shown in FIG. 3, the microcontroller 51 may be used only for gain control and other "smart sensing" functions. These functions may be eliminated or may perform additional processing tasks. Alternately, the analog signal may be routed to a separate processor board (e.g., processor 25), or the sensor sub-assembly 16' may use analog signal processing. In another example, the processor 25 in FIGS. 2A-2C, and microcontroller 51 may be one in the same; e.g., the same device with dual functionality. In such an example, the processing and calibration may occur within the system 100, and the system may transmit processed data wirelessly. For example, the system 100 may provide information pertaining to wireless transmission and total power consumption, among other features. In another example, the system 100 may be configured as a battery-powered device, and the system may monitor sensor power consumption and energy reserves.

The PCB 20 shown in FIG. 3 does not show other active and passive circuit features commonly associated with printed circuit boards so as not to unnecessarily obscure the features associated with the embodiments herein. Many of these circuit features are standard components in printed circuit board technology and those skilled in the art would readily understand how and where such features would be configured on the PCB 20.

The PCB 20 may preferably communicate with 1-Wire and Serial Peripheral Interface (SPI) protocols through a microcontroller 51 communicating with a processor 25 (shown in FIG. 2) or other processing device, to obtain ideal sensor characteristics from the user through a Transducer Electronic Data Sheet (TEDS) compliant (IEEE std. 1451) interface. The 1-Wire protocol is a digital communication standard that allows several devices to communicate over a single electrical connection (not including ground). The 1-Wire protocol may be utilized to communicate digital information about each transducer in a TEDS-compliant manner during sensor initialization, thereby providing a "smart sensor" capability. Additionally, the 1-Wire protocol may be implemented with software in the microcontroller 51 that also performs other "smart sensing" functions, which saves power and board space, and keeps the component count and cost down. In accordance with an embodiment herein, the processor 25 records the sensor outputs, and communicates with other devices and end users, typically via a network. In various examples, the processor 25 may be a personal computer running MATLAB® software, for example, in a laboratory environment, or the processor 25 may be a low-power microcontroller or a field-programmable gate array (FPGA) running embedded code in an operational environment. Other implementations of the processor 25 are also possible in accordance with the embodiments herein. The PCB 20 may automatically adjust sensor gains and offsets based on the type of cable 30 and user parameters, which maximizes dynamic range autonomously. The system 100 may be used with a calibration procedure that allows original current and voltage information to be extracted. Many possible calibration methods exist and may be used in accordance with the embodiments herein.

In embodiments, the magnetic field sensors may be arranged in a line across on the PCB 20, so that in operation they measure the magnetic field emitted by an energized power cable 30 to at two or more spatially-diverse locations. In an example system implementation shown, the magnetic field sensor subassembly 16' is oriented such at the magnetic field sensors 16a . . . 16n are positioned transverse to the power cable 30 being sensed. If the power conductors are oriented generally parallel to the cable (as is normally the case in conventional conductors and cable), then the sensed field at each of the two sensor locations is essentially the same at power frequencies. Accordingly, it may be advantageous to have multiple magnetic field sensors (e.g., at least two, and preferably three or more) in a sensor unit 19 positioned transverse to the power cable 30 (or around the cable 30 in other embodiments), where the fields in a multi-conductor cable are expected to vary.

In an example, the magnetic-field sensors 16a . . . 16n may provide an accurate measurement of a ±10 mT magnetic field in the sensitive direction. In one particular embodiment, the output voltage of the magnetic field sensor is linear with a magnetic field strength up to a maximum chip output of 50-mV amplitude, for example. Accordingly, the magnetic sensitivity Ω for the sensor may be calculated as:

$$\Omega = \frac{V_{out}}{B} = 5\frac{V}{T} \tag{6}$$

The number and relative position of the sensors 15a . . . 15n, 16a . . . 16n are selectively chosen to maximize the signal diversity when placed over a typical 120/240-V split-phase power cable that may be used to provide 200-A utility service to a typical home. Other number and configuration of these transducers are possible for other specific scenarios.

FIGS. 6A-6E show five examples of non-contact power meter systems 100A-100E for measuring power in a multi-conductor energized cable according to embodiments. The cable 30 here is a 3-phase power cable. The system are comprised on one or more sensor units 19 which couple to the processor 25. Each of the systems 100A, 100B, 100C, 100D and 100E provides increased field diversity of the sensors (i.e., measuring more than one field component).

The sensor units 19 may be placed proximate (i.e., on or near) the exterior of the cable 30.

The sensor units 19 may be in independent, separate housings, attached ad-hoc to the surface of the cable, each feeding sensor data into the processor 25 as shown in FIGS. 6A-6C and 6E. Or two or more the sensor units 19 could be incorporated into a common housing, as shown in FIG. 6D). For ease of illustration, the PCB is merely depicted as a line tangential to the cable and the magnetic field sensors are illustrated based on their orientations in these figures.

Figure 6A:
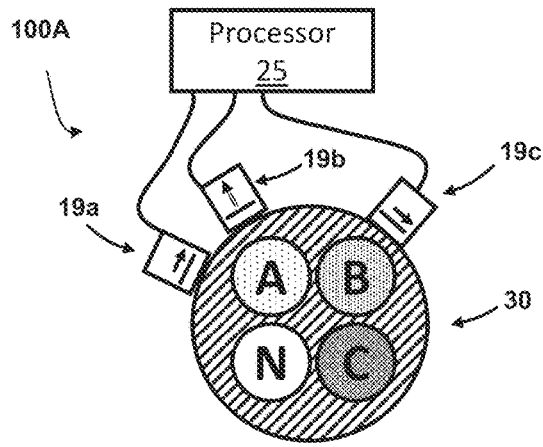
FIGS. 6A-6E show five examples of non-contact power meter systems for measuring power in a multi-conductor energized cable according to embodiments.
Figure 6B:
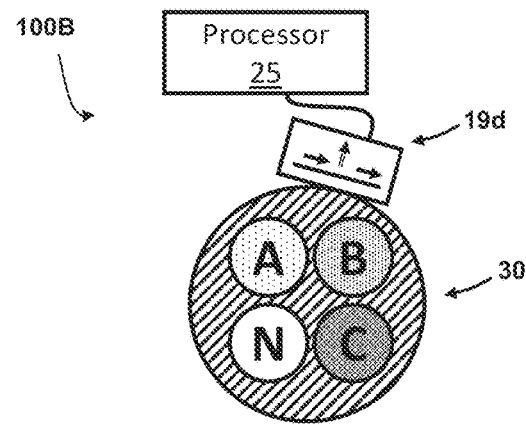

FIG. 6A shows a first system 100A comprised of three sensor units 19a, 19b, 19c. Here, the first sensor unit 19a and the third sensor unit 19c are provided each having at least one magnetic field sensor which measures the magnetic field in the tangential direction, and the second sensor unit 19b is provided having at least one magnetic field sensor which measures the magnetic field in the radial direction. Spatial diversity of the sensor units 19 may be increased by distributing them over a greater portion of the circumference of the cable 30. FIG. 6B shows another system 100B comprised of a single sensor unit 19d. This assembly includes right and left magnetic field sensors which measure the magnetic field in the tangential direction, and a center sensor which measures the magnetic field in the radial direction. In this example (FIG. 6B), the sensors are all mounted on the same PCB, and so the positions are fixed relative to each other.

Figure 6C:
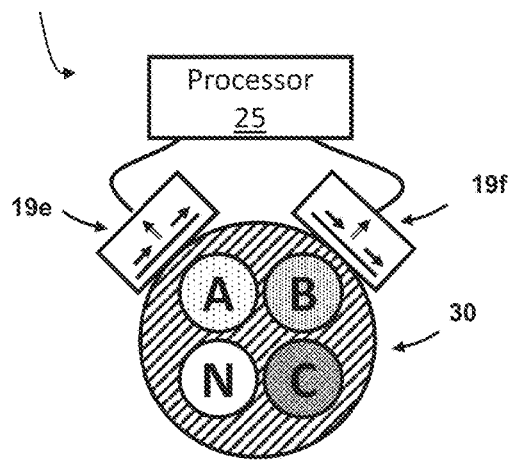
Figure 6D:
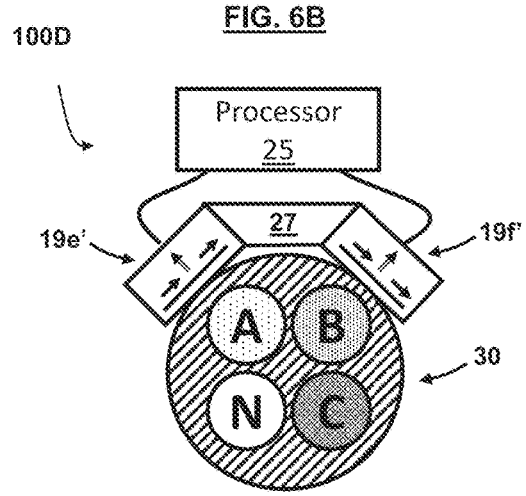
Figure 6E:
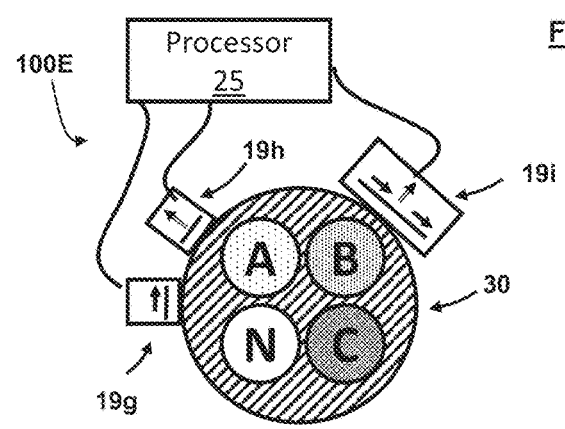

FIG. 6C shows yet another system 100C comprised of two sensor units 19e, 19f. Both sensor units 19e, 19f may be identical and include right and left sensors which measure the magnetic field in the tangential direction, and a center sensor which measures the magnetic field in the radial direction. Compared to the system of FIG. 6B, the second, the additional sensor unit provides even greater spatial diversity. FIG. 6D shows a further system 100D comprised of two sensor units 19e', 19f'. It is configured similarly to system 100C (in FIG. 6C). However, while sensor units 19e, 19f are separate and discrete units in the former system, the sensor units 19e', 19f are incorporate into a common housing 27 in system 100D. FIG. 6E shows one further system 100E comprised of three sensor units 19g, 19h, 19i. The first sensor unit 19h is provided having at least one sensor which measures the magnetic field in the tangential direction, and the second sensor unit 19h is provided having at least one sensor which measures the magnetic field in the radial direction. The third sensor unit 19i is provided having three sensors; it includes right and left sensors which measure the magnetic field in the tangential direction, and a center sensor which measures the magnetic field in the radial direction. Spatial diversity of the sensor assemblies may be increased by distributing them over a greater portion of the circumference of the cable 30.

Figure 7:
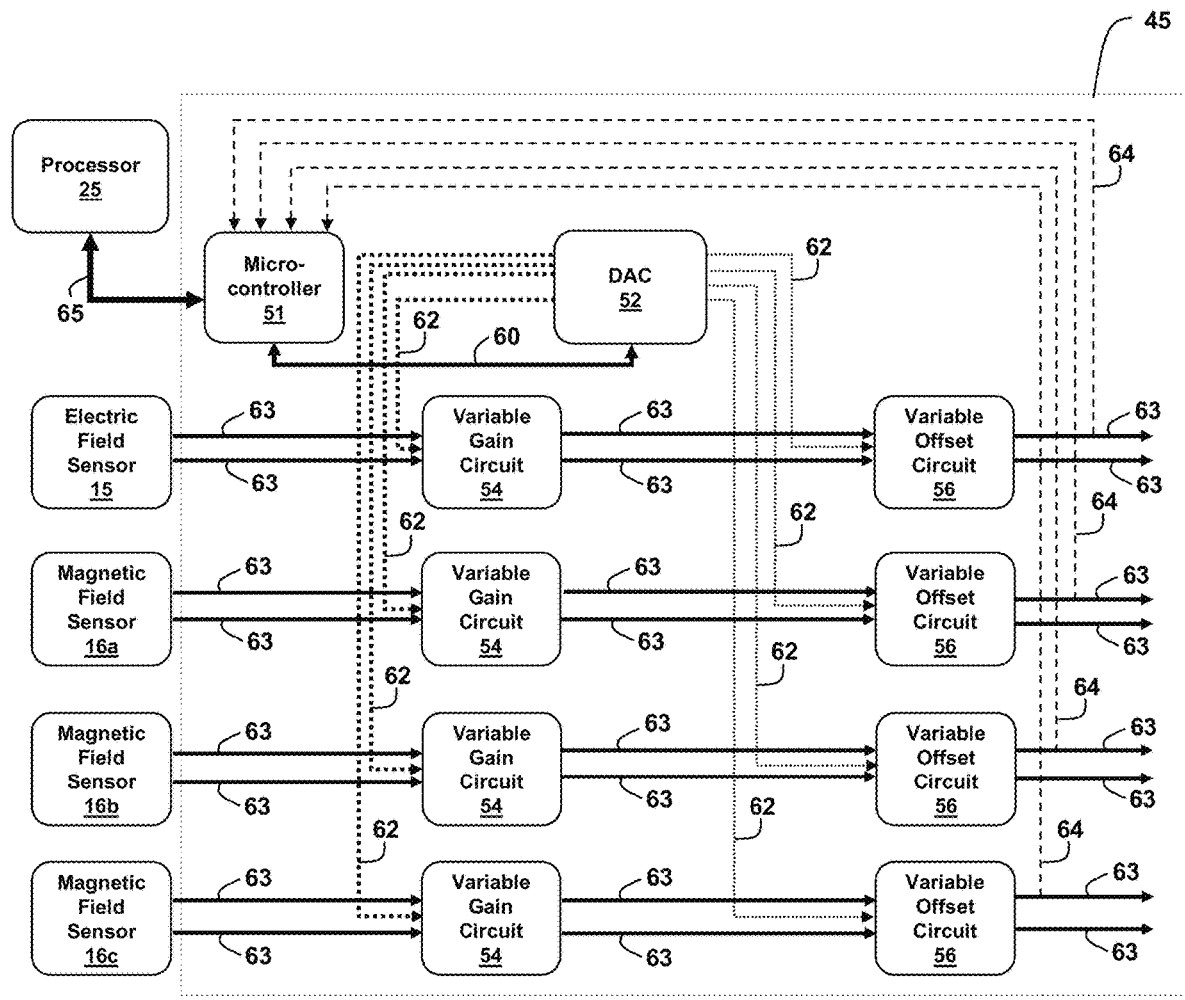
FIG. 7 is a system block diagram of the control processes used by the processor of the non-contact power meter system according to one exemplary embodiment.

FIG. 7 is a system block diagram of the control processes used by the processor 25 of the non-contact power meter system 100 (see FIG. 2B) according to one embodiment described herein. The following description assumes a single sensor unit 19 is comprised of one electric field sensor 15 and three magnetic field sensors 16a, 16b, 16c. The processes may be adapted for any other sensor configurations (whether on a single or multiple sensor units 19).

The processor 25 of system 100 adjusts itself on start-up based on the type of cable 30 to increase the usable dynamic range and linearity of its output. The processor 25 works in conjunction with signal processing components 50 (see FIG. 2B) on the sensor units 15 and 16a-16c including a signal conditioning module 45 comprising a microcontroller 51, digital-to-analog converter (DAC) 52, variable gain circuit 54, and variable offset circuit (e.g., an operational amplifier (op-amp)) 56. With reference to FIG. 3, the DAC 52, variable gain circuit 54, and variable offset circuit 56 are preferentially located on the top layer 21a of the PCB 20, so that they can be isolated from the sensor front end. In one embodiment, the DAC 52 comprises an 8-channel DAC. The connections of electric field sensor 15 and magnetic field sensors 16a-16c to the signal conditioning module 45 are shown in FIG. 7. Here, there are four sensor units 15 and 16a-16c, so a 4-channel digital acquisition (DAQ) can be used.

FIG. 7 shows four sensor transducers that are managed over a single 1-Wire interface 65. The system 100 optimizes its own gain voltage and offset voltage using the signal conditioning module 45 in the following manner: (1) The microcontroller 51 reads ferroelectric random-access memory (FRAM) (not shown) for current DAC outputs on the four channels of the DAC 52. (2) The microcontroller 51 changes the digital value for one of four DAC channels through the SPI bus 60. (3) The DAC 52 sets the corresponding analog output voltage to a desired variable circuit input 62. (4) The variable gain circuit 54 and/or variable offset circuit 56 change the outputs signals 63. (5) The output signal 64 is measured by the analog-to-digital converters (ADCs) (not explicitly shown) of the microcontroller 51. Based on the ADC measurement the microcontroller 51 increases or decreases the DAC 52 setting (then repeats steps 1-5 above), or keeps the DAC 52 setting and stores the setting in FRAM. This automatic gain control (AGC) feature is particularly useful with 10-12 bit ADCs, which are available at lower power and cost than 16-24-bit ADCs, and are often included in microcontroller chips. In this way, the system 100 may adapt to a wide variety of power cables 30, without the need to use a high-performance ADC.

The differential output currents of all the magnetic field sensors (e.g., Hall-Effect sensors) 16a-16c and the electric field sensor (e.g., charge induction electric-field sensor) 15 are operatively connected to the variable gain circuit 54, wherein the variable gain circuit 54 may change the gain magnitude across an 80-dB (1-10000 times) range depending on the variable gain $V_g$ in circuit 54. This may provide a total operating range up to 140 dB, even with a 10-12 bit ADC with only approximately 60 dB of instantaneous dynamic range. The variable gain circuit 54 includes associated resistors (not shown) and capacitors (not shown).

The DC offset of the output signal 64 is dependent on both the input DC offset and $V_g$, so one may ensure a DC offset at 1.65 V, for example, with the variable offset circuit 56 immediately following the variable gain circuit 54. The variable offset circuit 56 common-mode voltage ($V_{CM}$) pin(s) (not shown) are connected to different channels on the DAC 52. Accordingly, the voltage may be adjusted on each of the $V_{CM}$ pins, thereby changing the DC offset of the variable offset circuit 56 output. The variable offset circuit 56 includes associated capacitors (not shown). The microcontroller 51 acts as the master for the SPI 60 and 1-Wire devices on the electric field sensor 15 and magnetic field sensor 16, but as a slave 1-Wire device for a 1-Wire compatible processor 25.

The individual sensor gains may be automatically adjusted on demand by the processor 25 to maintain a high Signal-to-Noise Ratio (SNR) for optimal performance. If the sensor gains are adjusted dynamically, then 1) the gain values may be transmitted to the calibration module (section (D) in FIG. 9A); or 2) gain-independent physical units (e.g., mT) may be transmitted to the calibration module. The system 100 may be turned on with a DC voltage (e.g., DC +3.3V single-ended supply). The embodiments herein are not restricted to a DC +3.3 V single-ended supply. With a calibration procedure, the voltage and current magnitudes and phases may then be extracted in real time for each conductor in the cable 30.

In one embodiment, the sensor units 19 of the system 100 may be configured as a 1.25"×2" sensor unit PCB (i.e., PCB 20), for example, for simultaneous electric and magnetic field measurements of an energized conductor in the cable 30. FIG. 3 shows a single PCB 20, with a top side 21$a$ and a bottom side 21$b$, in more detail. The system 100 adjusts its own output characteristics (gain, offset) on start-up dependent on the type of cable 30 to which the system 100 is attached. In this way, the system 100 may be used to estimate voltage and current from the sensed fields. Because the sensors can sense the fields through the cable insulation, the system 100 provided by the embodiments herein does not require power outages or other special safety regulations for installation. Sensor calibration parameters, output gain, output DC offset, and device ID information may readily be extracted or altered by any 1-Wire or SPI master device as long as a +3.3V supply is provided for the system 100.

The non-contact power meter system 100 provided by the embodiments herein may be used for mobile power monitoring and energy auditing. The system 100 allows voltage and current monitoring without service outage and electrician. For example, the system 100 allows for externally monitoring of residential homes without the need for Lock-Out/Tag-Out, permits, or licensed electricians for installation and monitoring of tactical microgrids, etc. The embodiments herein allow for measuring power on multi-conductor cables 30, estimating current and voltage information for a variety of applications, including load detection, non-invasive monitoring of power quality and power-system faults, and load monitoring for condition-based maintenance.

Figures 8A, 8B, 8C:
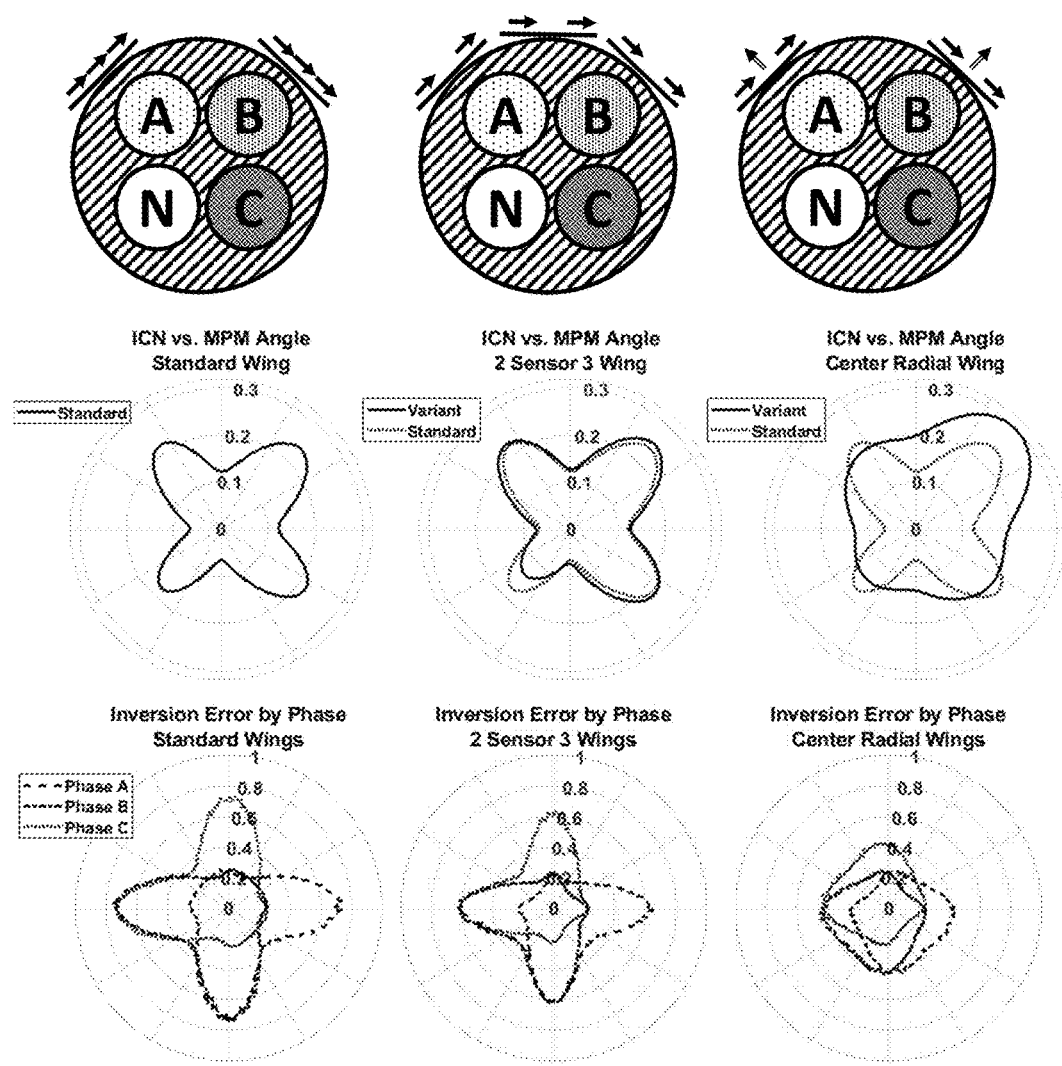
FIGS. 8A, 8B and 8C show schematics and corresponding measurement data for three magnetic field sensor configurations around a 3-phase, 200-A cable considered by the inventors.

FIGS. 8A, 8B and 8C show schematics of selected sensor locations and orientations, and corresponding measurement errors for three magnetic field sensor configurations around a 3-phase, 200-A cable considered by the inventors. In each of these drawings: the top figure is a schematic of a particular magnetic-field sensor assembly configuration considered; the middle figure is a plot of the inverse condition number (in general, larger value is better) as a function of sensor assembly angle around the cable for the configuration; and the bottom figure is a plot of the per-phase error in reconstructed current (in general, smaller value is better) as a function of sensor assembly angle for the configuration around the cable. In the plots, the values vary as a function of angle around the cable.

The sensor configuration in FIG. 8A comprises two sensor assemblies each with three sensors which measure the magnetic-field in tangential direction. (It will be noted that this configuration generally corresponds the embodiment in FIG. 6 of the aforementioned '894 patent application). The data shows that this configuration yields poor performance when the sensor unit is at 0, 90, 180, or 270 degrees.

The sensor configuration in FIG. 8B comprises three sensor assemblies each with two magnetic field sensors which measure the magnetic field in tangential direction (as the arrows depict). While providing the additional sensor assembly increases spatial diversity (compared to the configuration in FIG. 8A), the data shows does not significantly improve the measurement accuracy.

Lastly, the sensor configuration in FIG. 8C comprises two sensor assemblies each with three magnetic field sensors. While the left and right sensors of each assembly measure the magnetic-field in tangential direction, their center sensors measure the magnetic field in the radial direction. Here, the data shows that both the inverse condition number and inversion error is significantly improved compared the two previously-considered configurations, particularly for the worst-case sensor orientations where the performance improvements are needed the most.

Figure 9A:
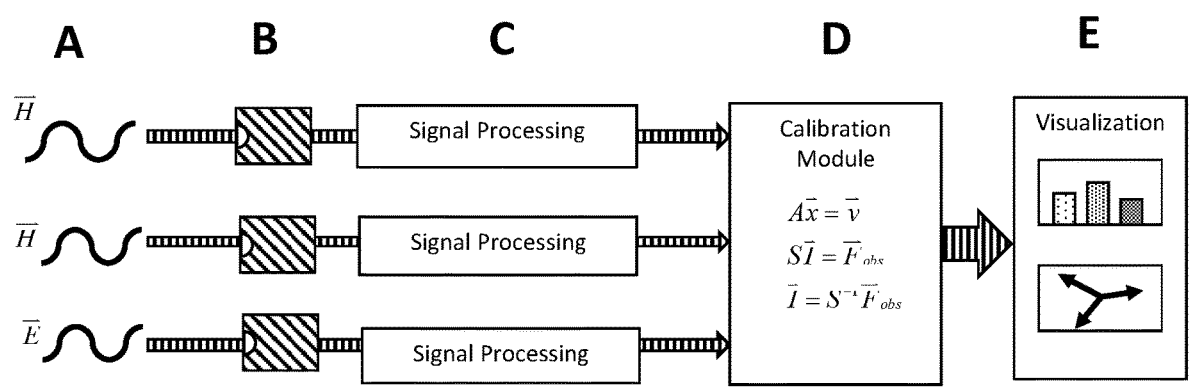
FIG. 9A shows an exemplary data processing pipeline for the processor of the power measuring system according to an exemplary embodiment.

FIG. 9A shows an exemplary data processing pipeline for processor 25 of the power measuring system according to an embodiment.

In section (A), the multi-conductor cable produces magnetic fields H and electric fields E. Next, in section (B), those fields are detected and measured using field sensor of the non-contact power meter system 100. For example, magnetic fields can be measured using Hall effect sensors or other magnetometers, electric fields can be measured charge induction sensors or other E-field sensors. Sensor selection is a design decision driven by performance metrics like frequency response, linearity, dynamic range, and sensitivity, and also by system constraints like size, weight, power, and cost (SWaP-C). In section (C), the time-domain output of the sensors are demodulated into magnitude and phase measurements. This can be performed by, for example, a discrete Fourier transform (DFT) where the sampling rate is chosen so that the desired demodulated frequency resides in one of the DFT frequency bins. Alternatively, it could be performed by filtering, multiplying by the desired demodulated frequency and integrating, taking advantage of the fact that sine waves of different frequencies are orthogonal (an example is the IEEE P- and M-Class synchrophasor estimators).

In section (D), these magnitude and phase measurements are multiplied by a matrix $S^{-1}$ that transforms a set of field measurements $F_{obs}$ into meaningful numbers such as complex voltage and complex current. Determining the elements of the calibration matrix S is a process that we call "phasor calibration." In this example, the matrix S maps the currents, I, to the fields $H_{obs}$. So the calibration module uses the inverse matrix, $S^{-1}$ to map the fields to the currents (or voltages).

Figure 9B:
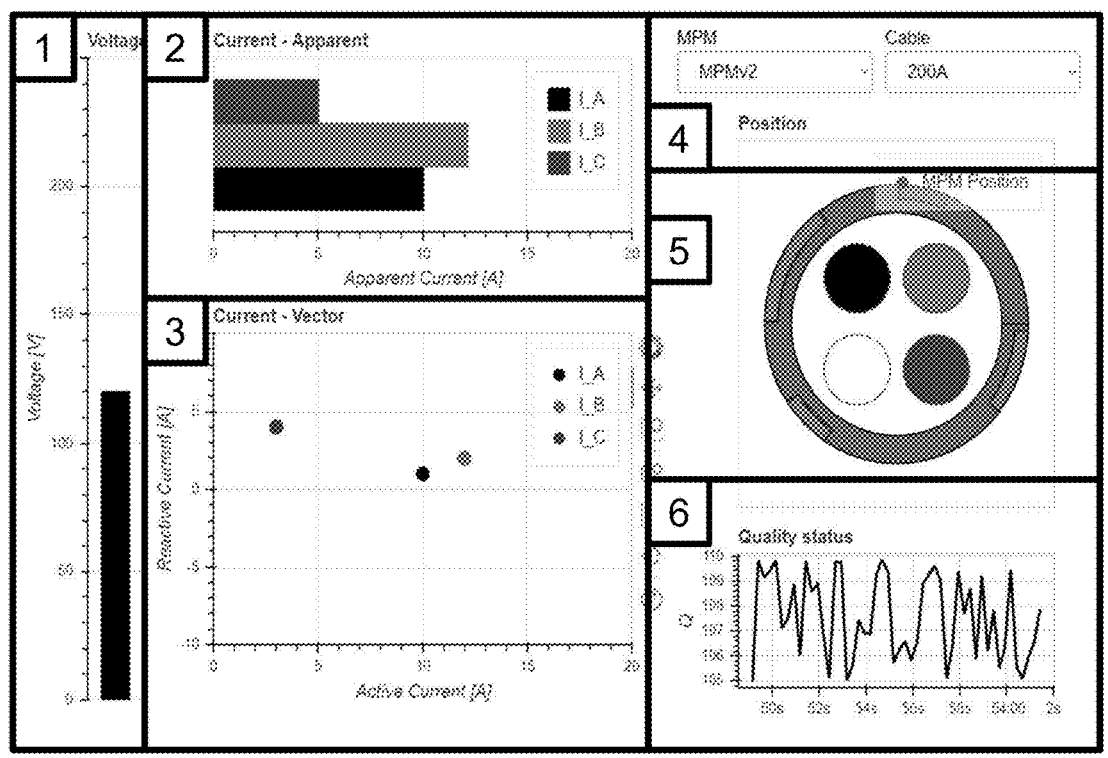
FIG. 9B shows an image of an exemplary display screen for the output according to an embodiment.

In section (E), these values can be visualized in a textual display or a graphical representation. FIG. 9B is an image of an exemplary display screen for the output of the data processing pipeline (E) according to an embodiment. The data may be processed by and rendered for presentation on a suitable display device for viewing by the processor 25 (or other image processor). For example, the display device may be a computer screen or a designated display provided on a discrete device embodiment. The displayed screen image may be updated in real-time as the data is received and processed. The exemplary screen image includes various sections (or panes) 1-6, as identified on that figure. The following sections/panes are merely some examples of the types of data that may be displayed.

In the exemplary screen image, section 1 is a voltage estimate. Since the current embodiment has only two electric-field sensors, we cannot solve for all three voltages (Va, Vb, Vc). Therefore, we assume: angle of Va=0°, angle of Vb=−120°, angle of Vc=+120°, |Va|=|Vb|=|Vc|. As a result, simply displaying |Va| contains important information about voltage that can be obtained. Section 2 is the apparent current. This plot displays the apparent current (i.e., absolute value of complex current) per conductor. Section 3 is vector current. This plot displays the real and imaginary component of the current per conductor. Section 4 includes user-selection dialogs. It may include drop-down boxes or the like for enabling (i) user-selection of the MPM (Mobile Power Meter), i.e., the sensor assembly model; and (ii) user-selection of cable type. These allow the corresponding algorithms to load the pre-computed field "dictionary" for the assembly and cable combination. Section 5 is a notional cable diagram for the energized cable. Here, it displays the estimated position of the sensor assembly relative to the interior conductors (e.g., A, B, C, and N). The regions around the conductor show inversion estimates for current and/or voltage. Section 6 is the quality indicator. This displays an estimate of the inversion quality/accuracy.

In this particular screen image, the measured power is not shown. That is because many users may be more interested seeing current and voltage as they tend to be more variable over time. This particular screen makes it easier to show the quantities broken out. Of course, $$\text{Power} = \text{Voltage} \times \text{Current} \tag{7}$$

This is the case for any individual conductor whether for a single phase cable or multiphase cable. In SI units, where voltage is in units of volts (V) and current is in units of amps (A), the computed power is in units of Watts (W). Also, note that the voltage and current can be complex, so the computed power can also take units of "var" (reactive only) or "VA" (general complex). The measured power is computed by the processor 25 and that value may be shown for the conductor(s) in other display screen embodiments if one so desires.

Other data and information can certainly be displayed as may be desired by users.

Figure 10A:
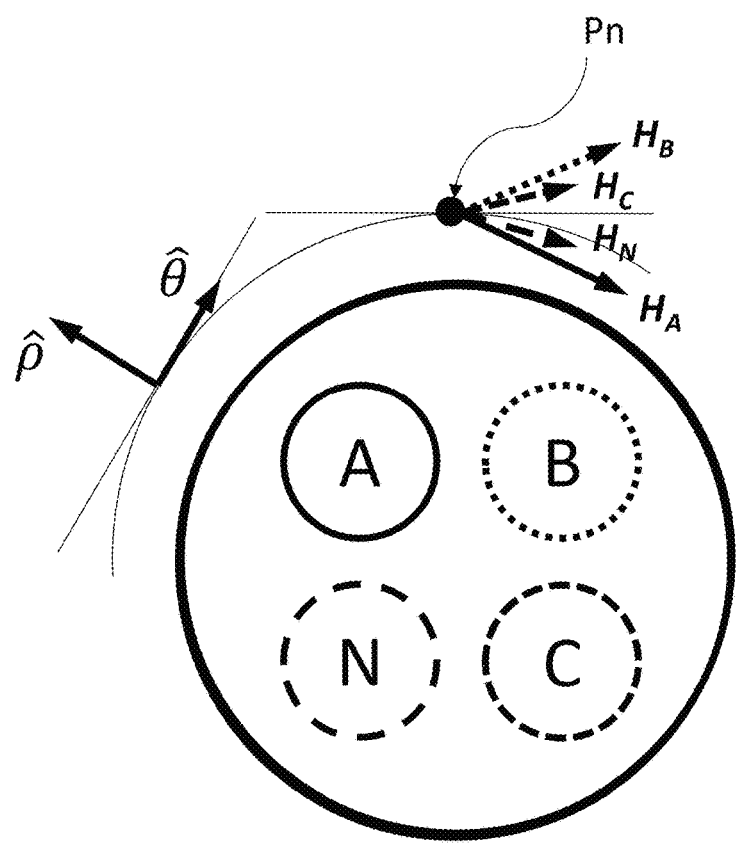

FIGS. 10A-10C show aspects of the section (D) of the processing of FIG. 9A. The sensor's positions with respect to the energized cable and understanding of the particular cable structure are prerequisites.

FIG. 10A shows the coordinate system shown for a cable and a vector in the direction of the magnetic field for each conductor of the cable at a point P. The constituent fields ($H_A$, $H_B$, $H_C$, and $H_N$) sum to form the total measured field. Each constituent field is in phase with the corresponding source currents, so the summation must take this into account. The magnitudes of these fields are proportional to the constituent currents, and inversely proportional to the distance to each conductor, according to the Biot-Savart Law. This assumes an infinitely long and thin conductor. The distance is from the center of the conductor. This is a reasonable first-order approximation. FIG. 10B shows the calibration matrix S. And FIG. 10C shows the inverse calibration matrix.

To convert measured magnetic-field measurements into current measurements of the conductors in the cable, multiple magnetic field measurements are taken and a calibration matrix relates these measurements to currents.

According to embodiments, by orienting one or more of the magnetic field sensors to measure magnetic field in the radial direction of the energized cable, the accuracy of the reconstructed currents improves and is more resilient to random noise. The basic idea is that inversion of an ill-conditioned matrix results in multiplication of measurement errors in the estimates of the currents (and voltages). So reducing the condition number (i.e., improving the orthogonality of the system of linear equations) improves the accuracy of the estimates. There are many ways to do this. One way is to more effectively distribute sensors around the cable. However, this increases mechanical complexity, and limits utility for cables of different diameters. Another is to sense both tangential and radial components of the field. This method required minimal mechanical changes, and was ultimately the method we used in embodiments of our Mobile Power Meter Phase 3 (MPM Ph3).

The currents on the conductors are obtained by multiplying the observed magnetic fields ($H_{obs}$) by the inverse of the S matrix ($S^{-1}$). The matrix S consists of three vectors ($S_{XN}(\theta)$)—the observed response of them sensors at sensor assembly angle $\theta$ for a 1-A current on phase X (A, B, or C, with return current (−1-A) along the neutral, N). In particular, those vectors are the dot product of the $n^{th}$ sensor sensitive axis at sensor assembly angle $\theta$ ($s_n(\theta)$) with the magnetic field measured at the $n^{th}$ sensor location at sensor assembly angle $\theta$ for 1-A of current on phase X ($h_n(\theta, XN)$).

Figure 11A:
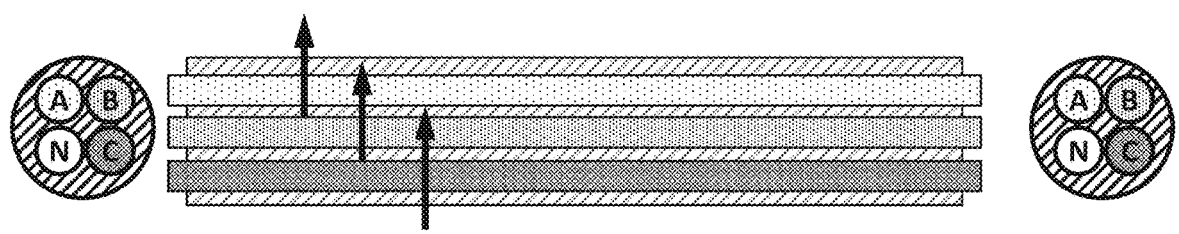
FIGS. 11A-11D show aspects for a methodology of measuring 3D twist of an energized cable using the non-contact power meter system according to embodiments.

FIGS. 11A-11D show aspects for a methodology of measuring 3D twist of an energized cable using the non-contact power meter system according to embodiments. The improvements described in this invention (measuring the radial field) hold for a "pseudo-two-dimensional" (straight) or three-dimensional (twisted) cable. In the 3D twisted cable, measuring the field in yet another orthogonal direction (along the cable, i.e., the axial direction) can yield further information, namely the cable twist. The cable may be a typical three-phase, 200-A cable, as an example. FIG. 11A is an illustration showing a perfectly straight cable. Here, the magnetic fields are confined in a plane perpendicular to the direction of the cable. The fields will have both a radial and tangential component, but no component along the axial direction of the cable.

Figure 11B:
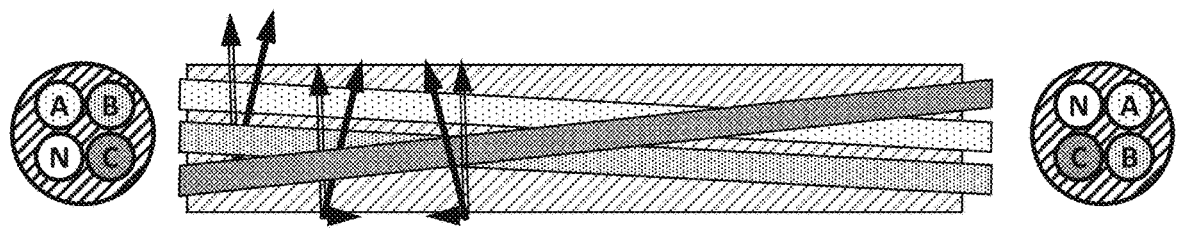

FIG. 11B is an illustration showing the cable where the inner conductors are twisted. There is a component of the field that is produced along the axial direction of the main cable. This axial component could be sensed by a three-axis magnetic field sensor, such as that shown in FIG. 4C.

Figure 11C:
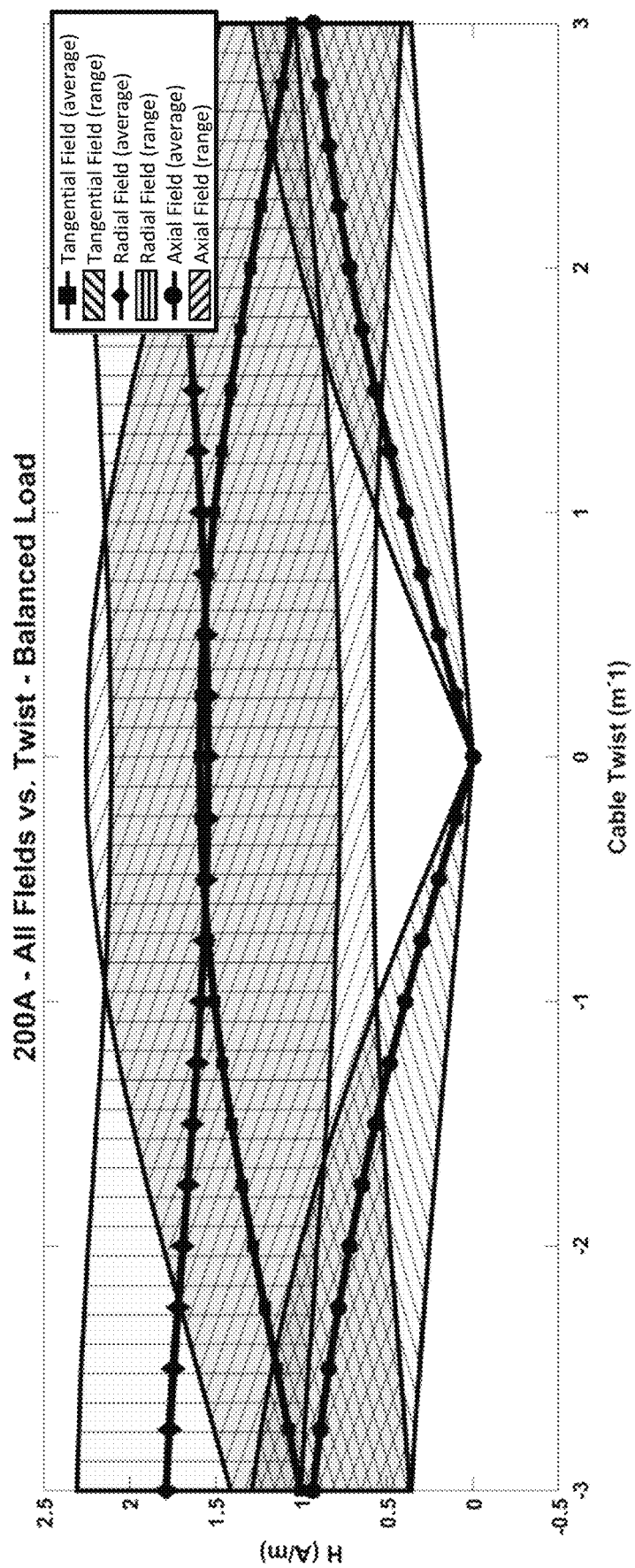

FIG. 11C is a plot of a simulation showing the radial, tangential, and axial field component as a function of cable twist for a three-phase, 200-A cable. The simulated data assumes a balanced load, but a balanced load is not a prerequisite for using the axial field to determine twist. All field components: tangential (to the surface of the cable), radial (normal to the cable surface), and axial (parallel to the long axis of the cable) are plotted. This plot shows the average field strength around the cable as a function of cable twist (measured as twists per inverse meter, zero twist per inverse meter being a non-twisted, straight cable). Since the field varies as a function of angle around the cable, minimum and maximum absolute field values are plotted as bands with the average field value around the cable plotted as a line. At zero twist, there is no field along the direction of the cable (as predicted by symmetry), but as the cable begins to twist and that symmetry is broken, there arises some field along the direction of the cable.

Figure 11D:
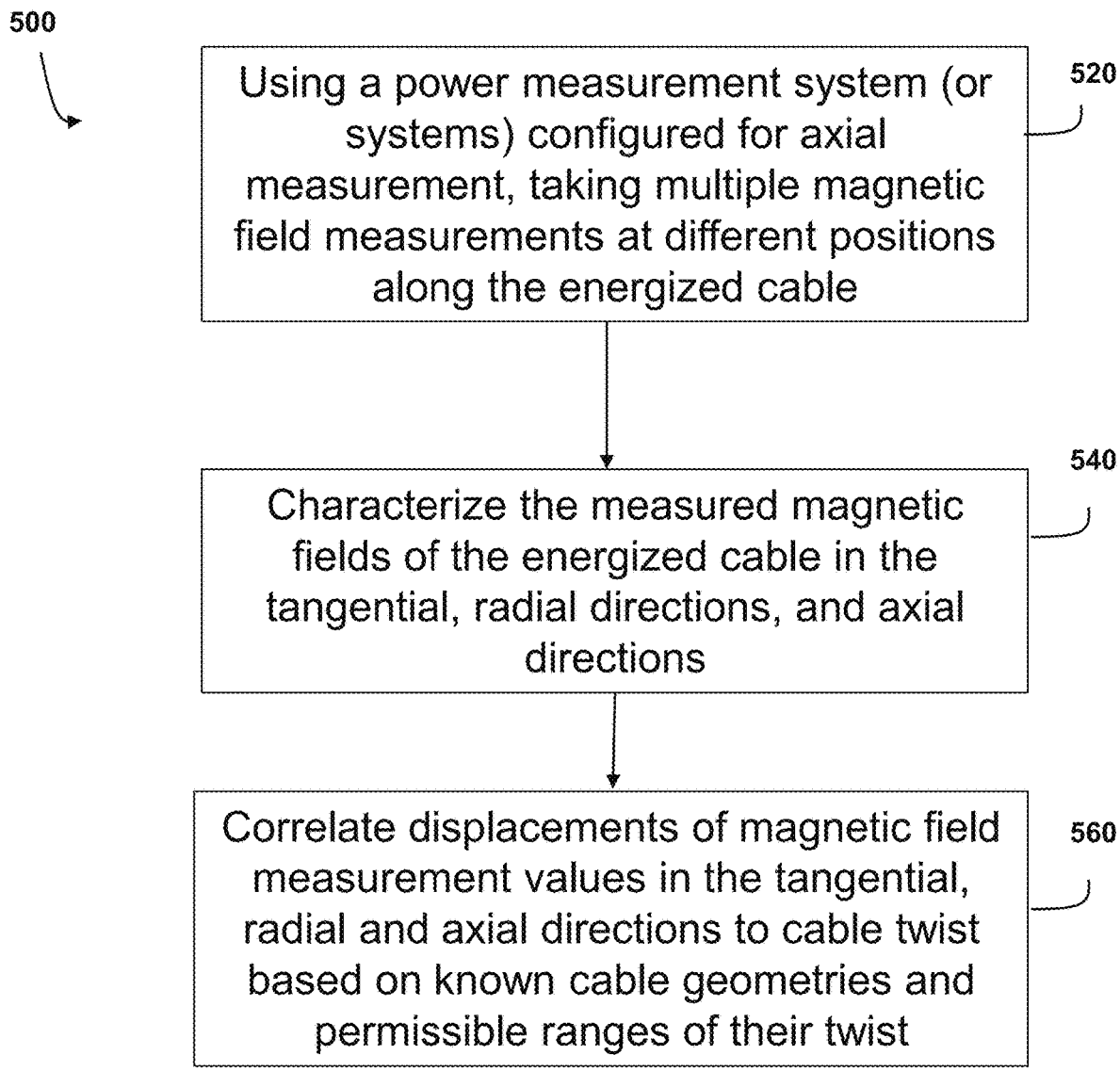

FIG. 11D is method 500 for measuring 3D twist of an energized cable using the novel power measurement system according to embodiments. Twist is important for determining whether conductors may be kinked and/or over-twisted; these conditions put undue stress on the conductors which could lead to cracking, breakage, shorts, etc., negatively impacting the cable. Thresholds for permissible cable twist could be established, and alerts (visual/audio) might generated when twists values exceed such thresholds. Twist may also be used to help identify a specific cable type, and thus improve calibration accuracy.

In step 520, using a power measurement system (or systems), we take multiple magnetic field measurements at different positions along the energized cable. Such a system for this method may use a sensor unit or units configured to provide for axial magnetic field measurement. In some case, measurements at multiple axial positions (along the length of the cable) may be made. If we have at least one (and preferably two or more) axial field measurements, we should be able to estimate twist as another unknown.

In one embodiment, one system could be used in which a first measurement is taken at first axial positon along the cable, the system moved to a second axial position, a second measurement is taken at the second axial positon, the system moved again, and so forth, for various measurements. Another way could be placing multiple systems at different axial locations along the energized cable and taking measurements; in this way, the measurements can be taken at substantially the same time. Or, in further ways, some combination of the two techniques might be used. In general, greater accuracy (to a point) should follow with more measurements taken over an axial distance that is a significant fraction of the twist length the energized cable. The system(s) provide measurements of the magnetic field in the tangential, radial and axial directions. By adding the axial measurements at different axial positions along the energized cable, we can better understand the magnetic fields at any given point of the cable under consideration.

Alternatively or additionally, a two- or three-axis magnetic-field sensor, which gives a tangential (and/or radial) measurements, might be used. There may be more measurement error in just using the non-axial measurements. But, with multiple tangential and radial measurements, the accuracy should be improved.

Next, in step 540, we can characterize the measured magnetic fields of the energized cable for the in the tangential, radial directions, and axial directions. This may be achieved using a digital memory which stores measured magnetic field for point in three axes space. If so desired, 2D or 3D renderings of the magnetic fields of the energized cable can be made.

And, continuing to step 560, we can correlate displacements of magnetic field measurement values in the tangential, radial and axial directions to cable twist based on known cable geometries and permissible ranges of their twist. Measured and/or simulated data for various type of energized cables and twist can be generated a priori. (As mentioned above, one simple 2D plot of simulated measurement data as a function of twist was shown in FIG. 11C for a typical three-phase, 200-A cable). Combining the a priori data with known or measured (as described above) loads and comparing to the measured data should readily identify the average twist present in the cable being measured. That is because we know the potential ranges (and average values) of twist for a given cable. And, for instance, by applying a normalization technique to the data under comparison, and we can look for values falling within certain predetermined ranges and/or which have similar shape (or slope) to average twist values lines. This can be done for each of the power conductors of the energized cable. Once trend(s) are identified, we can assume similar twist.

Figure 12:
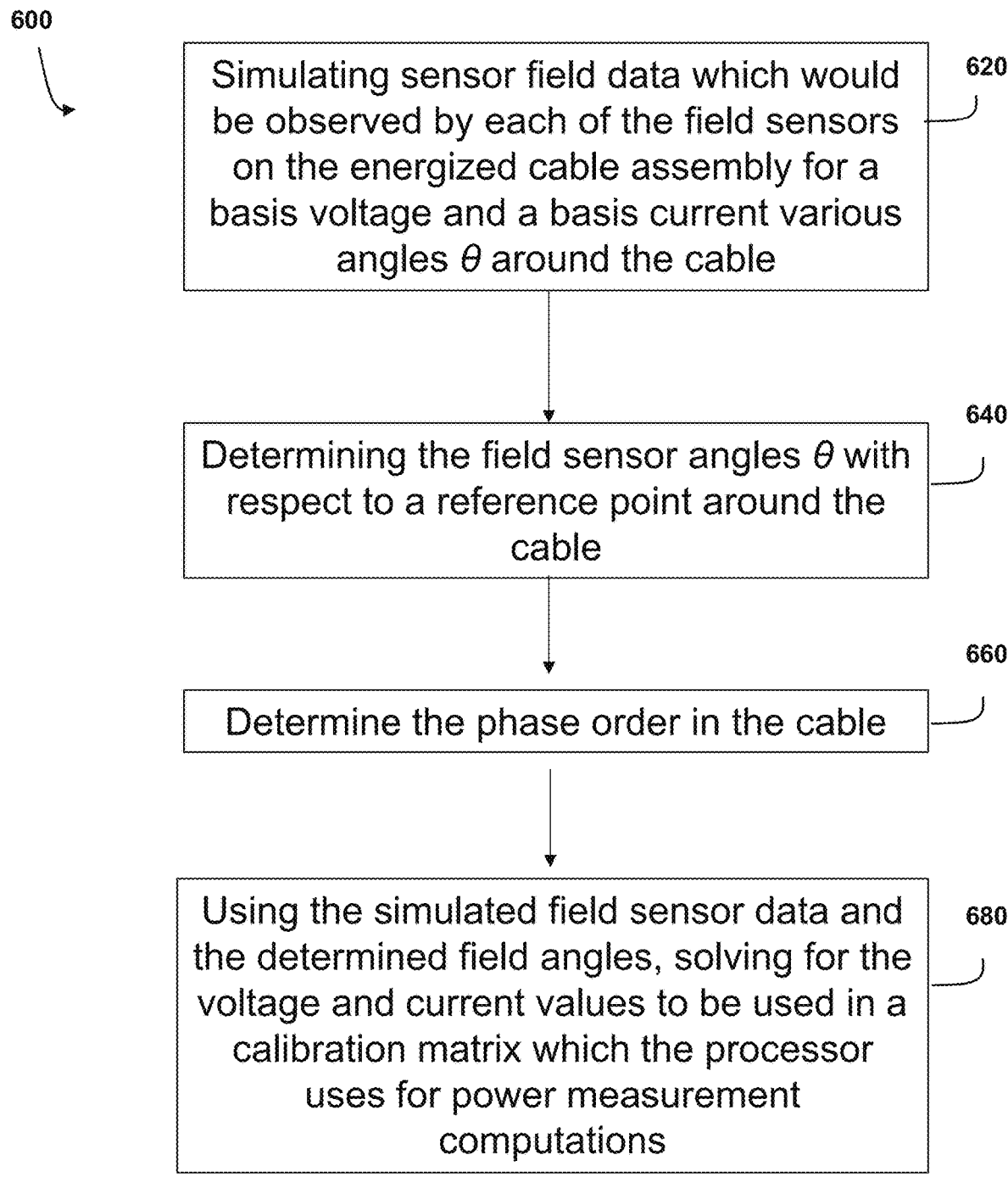
FIG. 12 shows one exemplary auto-calibration method according to an embodiment.

In some embodiments, an automatic calibration method can be performed. FIG. 12 shows one exemplary auto-calibration method 600 according to an embodiment. It generates a calibration matrix which the processor later uses for power measurement computations. These following steps may be performed by the processor 25. In step 620, the processor simulates the fields observed by each of the field sensors on the cable assembly for a "basis voltage" (e.g., 1 V on each phase with appropriate phase angles), and a "basis current" (e.g., 1 Amp on each phase) for various angles θ around the cable.

Two implicit assumptions may be made with respect to this step. First, it is assumed that all load currents return via the neutral conductor: that is, $I_N=-(I_A+I_B+I_C)$. The second assumption is that the currents in all of the ground conductors is zero. This is adequate for a well-functioning power system, but may not be valid in the case of ground faults, ground loops, or other conditions. If we want to estimate the currents in these conductors, additional magnetic-field sensors are required. Following the first assumption that $I_N = -(I_A+I_B+I_C)$, we have two embodiments:

1. Implicit estimation of neutral current. As an example in this case, we apply 1 Amp along the conductor and −1 Amp along the neutral. This forms the s_XN matrix elements.

2. Explicit estimation of the neutral current. For example, we apply 1 Amp along each conductor, including the neutral. This "renames" the s_XN matrix elements to just s_X, and adds an additional column of s_N matrix elements, and an additional parameter in the state vector; [V, IA, IB, IC] becomes [V, IA, IB, IC, IN].

Next, in step 640, the processor determines the field sensor angles θ with respect to a reference point around the cable. This might be done with field sensor values by comparing the predicted electric field values at all angles around the cable with the observed electric field values to determine the angles θ with the best correlation in values. To avoid ambiguities two or more electric field sensors should be used. The comparison may be made by any number of algorithms, for example:

1. Kalman filter (estimate angles θ, current I and voltage V, predict fields, and use Kalman filter to update these parameters);
2. Iterative parameter minimization (estimate angles θ, current I and voltage V, predict fields, re-evaluate estimates, and repeat until results converge); or
3. Distance Minimization (e.g., apply least squares inversion for all angles θ, pick the one that yields voltage V closest to an expected value (e.g., 120 V), and current I closest to being real-valued currents).

In step 660, the phase order in the cable (e.g., positive, ABC, phasing vs. negative, ACB, phasing) is determined by the relative phase of two electric field sensors. For instance, a positive phase order (ABC) may have the phase of the electric field sensor #2 lagging the phase of electric field sensor #1, in which case, the negative phase order (ACB) will show electric field sensor #2 leading field sensor #1. It is noted that phase order and orientation are linked. Assuming only positive current draw, then for the sensor oriented correctly, it will determine; ABC phase order and positive currents. For the sensor oriented in the other direction along the cable, it will determine ACB phasor order and negative currents.

Then, in step 680, using the simulated field sensor data and the determined field angles, the processor solves for the voltage and current values to be used in the calibration matrix. This may be performed, for instance, by a least squares inversion (i.e., $S^{-1} \times$measured fields=[V, I]).

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the present disclosure and its practical applications, and to describe the actual partial implementation in the laboratory of the system which was assembled using a combination of existing equipment and equipment that could be readily obtained by the inventors, to thereby enable others skilled in the art to best utilize the invention and various embodiments with various modifications as may be suited to the particular use contemplated.

While the foregoing is directed to embodiments of the present invention, other and further embodiments of the invention may be devised without departing from the basic scope thereof, and the scope thereof is determined by the claims that follow.

We claim:

1. A non-contact power meter system for measuring power in an energized cable, the system comprising:
   at least one electric field sensor;
   a plurality of magnetic field sensors comprising at least two magnetic field sensors spaced in a direction transverse to the energized cable measured during use,
      wherein the at least two magnetic field sensors together are configured to measure a magnetic field in a tangential direction and a radial direction with respect the energized cable measured at the same time; and
   a processor, which receives measurement signals from said sensors, and is configured to measure power in said energized cable.

2. The system of claim 1, wherein there are at least N channels of magnetic field sensor directional measurement data provided to the processor for N conductors for transmission of electrical power of the energized cable.

3. The system of claim 2, wherein N is at least 3.

4. The system of claim 1, further comprising one or more sensor units, on which the field sensors are located.

5. The system of claim 4, wherein each sensor unit comprises a printed circuit board (PCB).

6. The system of claim 4, wherein the one or more sensor units comprise a magnetic field sensor sub-assembly.

7. The system of claim 4, wherein the one or more sensor units comprise an electric field sensor sub-assembly.

8. The system of claim 1, wherein one of the plurality of magnetic field sensors is oriented in a different direction from other magnetic field sensor(s) of the plurality of magnetic field sensors.

9. The system of claim 8, wherein one of the at least two magnetic field sensors physically rotated in a different direction of the same plane or a different orthogonal plane from the other magnetic field sensor(s).

10. The system of claim 1, wherein the plurality of at magnetic field sensors are configured to measure a magnetic field in substantially one direction, two orthogonal directions, or three orthogonal directions.

11. The system of claim 1, wherein said processor is configured to perform simultaneous electric and magnetic field measurements of an energized conductor in said energized cable.

12. The system of claim 4, wherein there are at least two sensor units.

13. The system of claim 12, wherein the at least two sensor units have separate housings and are individually positionable with respect to the energized cable measured.

14. The system of claim 12, wherein the at least two sensor units share a common housing.

15. The system of claim 12, wherein the at least two sensor units are positioned at substantially same axial location with respect to the energized cable.

16. The system of claim 1, wherein said processor is configured to measure voltage and current magnitudes and phases in real time for each conductor in said energized cable.

17. The system of claim 1, wherein said processor is a part of an integrated sensor unit or communicates therewith.

18. The system of claim 4, wherein the one or more sensor units further comprise means for attaching the system to a power cable.

19. The system of claim 18, wherein the means for attaching the system to a power cable comprise a clip, a strap, a fastener, a tape, and/or an adhesive.

20. The system of claim 1, wherein there are two or more electric field sensors.

21. The system of claim 20, wherein the processor uses relative phase between electric field sensors to determine phasing in individual conductors of the energized cable.

22. The system of claim 1, wherein the processor is configured to apply and compute cable models for the energized cable which are used for power measurement.

23. The system of claim 22, wherein the processor later uses the computed cable models to compute current and voltage values by inversion of field measurement values.

24. The system of claim 1, wherein at least one of the plurality of magnetic field sensors is also configured to measure a magnetic field in an axial direction with respect the energized cable measured.

25. The system of claim 24, where said processor is further configured to estimate a twist of conductors in the energized cable measured by:
   taking multiple magnetic field measurements at different axial positions along the energized cable;
   characterizing the measured magnetic fields of the energized cable in the tangential, radial directions, and axial directions; and
   correlating displacements of magnetic field measurement values in the tangential, radial and axial directions to cable twist based on known cable geometries and permissible ranges of their twist.

26. A method of determining twist in an energized cable comprising:
   using one or more of the power meter systems of claim 1 configured to provide for axial magnetic field measurements, taking multiple magnetic field measurements at different axial positions along the energized cable;
   characterizing the measured magnetic fields of the energized cable in the tangential, radial directions, and axial directions; and
   correlating displacements of magnetic field measurement values in the tangential, radial and axial directions to cable twist based on known cable geometries and permissible ranges of their twist.

27. The system of claim 1, wherein the at least two magnetic field sensors are arranged in a line that is oriented in the transverse direction to the energized cable measured during use.

28. The system of claim 27, wherein at least two magnetic field sensors in the line are each configured to measure a magnetic field in the tangential direction at the same time during use.

29. The system of claim 12, wherein the at least two sensor units are arranged to lie around the circumference of the energized cable during use.

* * * * *